(12) United States Patent
Yamaguchi et al.

(10) Patent No.: US 10,504,965 B2
(45) Date of Patent: Dec. 10, 2019

(54) SOLID-STATE IMAGING DEVICE

(71) Applicant: SONY SEMICONDUCTOR SOLUTIONS CORPORATION, Kanagawa (JP)

(72) Inventors: Tetsuji Yamaguchi, Kanagawa (JP); Satoshi Keino, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/747,274

(22) PCT Filed: Aug. 3, 2016

(86) PCT No.: PCT/JP2016/003580
§ 371 (c)(1),
(2) Date: Jan. 24, 2018

(87) PCT Pub. No.: WO2017/026109
PCT Pub. Date: Feb. 16, 2017

(65) Prior Publication Data
US 2018/0219046 A1    Aug. 2, 2018

(30) Foreign Application Priority Data
Aug. 10, 2015 (JP) ................................ 2015-158109

(51) Int. Cl.
*H01L 27/30*    (2006.01)
*H01L 27/146*   (2006.01)
(Continued)

(52) U.S. Cl.
CPC ........ *H01L 27/307* (2013.01); *H01L 27/1463* (2013.01); *H01L 27/14623* (2013.01);
(Continued)

(58) Field of Classification Search
CPC . H01L 27/307; H01L 51/442; H01L 51/4253; H01L 27/14623; H01L 27/14647;
(Continued)

(56) References Cited

U.S. PATENT DOCUMENTS 6,100,158 A * 8/2000 Lee .................. H01L 21/76224
257/E21.546
2005/0062118 A1* 3/2005 Yaung ................ H01L 27/1463
257/414

(Continued)

FOREIGN PATENT DOCUMENTS

EP      2109143 A2    10/2009
WO      2014/002826 A1  1/2014

OTHER PUBLICATIONS

International Search Report and Written Opinion of PCT Application No. PCT/JP2016/003580, dated Oct. 24, 2016, 13 pages.

*Primary Examiner* — Su C Kim
(74) *Attorney, Agent, or Firm* — Chip Law Group

(57) ABSTRACT

Solid-state imaging devices, electronic apparatuses, and methods of forming image sensors are provided. A solid-state imaging device or an electronic apparatus incorporating a solid-state imaging device can include a substrate and at least a first photoelectric conversion element formed in the substrate. In addition, a region with a low dielectric constant is formed. The region can include a locally thin region formed in the substrate. An insulating film is at the first side of the substrate. Where the region includes a locally thin region, the interlayer insulating film can extend into that locally thin region. A first electrode is at a side of the interlayer insulating film opposite the substrate. The device further includes a second electrode, and a photoelectric conversion layer at least partially between the first electrode and the second electrode.

19 Claims, 18 Drawing Sheets

(51) Int. Cl.
*H01L 51/42* (2006.01)
*H01L 51/44* (2006.01)

(52) U.S. Cl.
CPC .... *H01L 27/14647* (2013.01); *H01L 51/4253* (2013.01); *H01L 51/442* (2013.01); *H01L 27/14636* (2013.01); *H01L 27/14692* (2013.01)

(58) Field of Classification Search
CPC ........... H01L 27/1463; H01L 27/14636; H01L 27/14692
See application file for complete search history.

(56) References Cited

U.S. PATENT DOCUMENTS

| | | |
|---|---|---|
| 2009/0166516 A1 | 7/2009 | Tamura et al. |
| 2011/0216212 A1* | 9/2011 | Watanabe ............ H04N 5/2353 348/222.1 |
| 2013/0001730 A1* | 1/2013 | Miyanami ......... H01L 27/14603 257/443 |
| 2013/0050126 A1* | 2/2013 | Kimura ............... G02F 1/13338 345/173 |
| 2013/0341491 A1* | 12/2013 | Hirose ................ H01L 27/1464 250/208.1 |
| 2014/0117486 A1* | 5/2014 | Doi ................... H01L 27/14665 257/448 |
| 2014/0264298 A1 | 9/2014 | Park |
| 2015/0091123 A1 | 4/2015 | Chang et al. |
| 2015/0325606 A1 | 11/2015 | Togashi et al. |

* cited by examiner

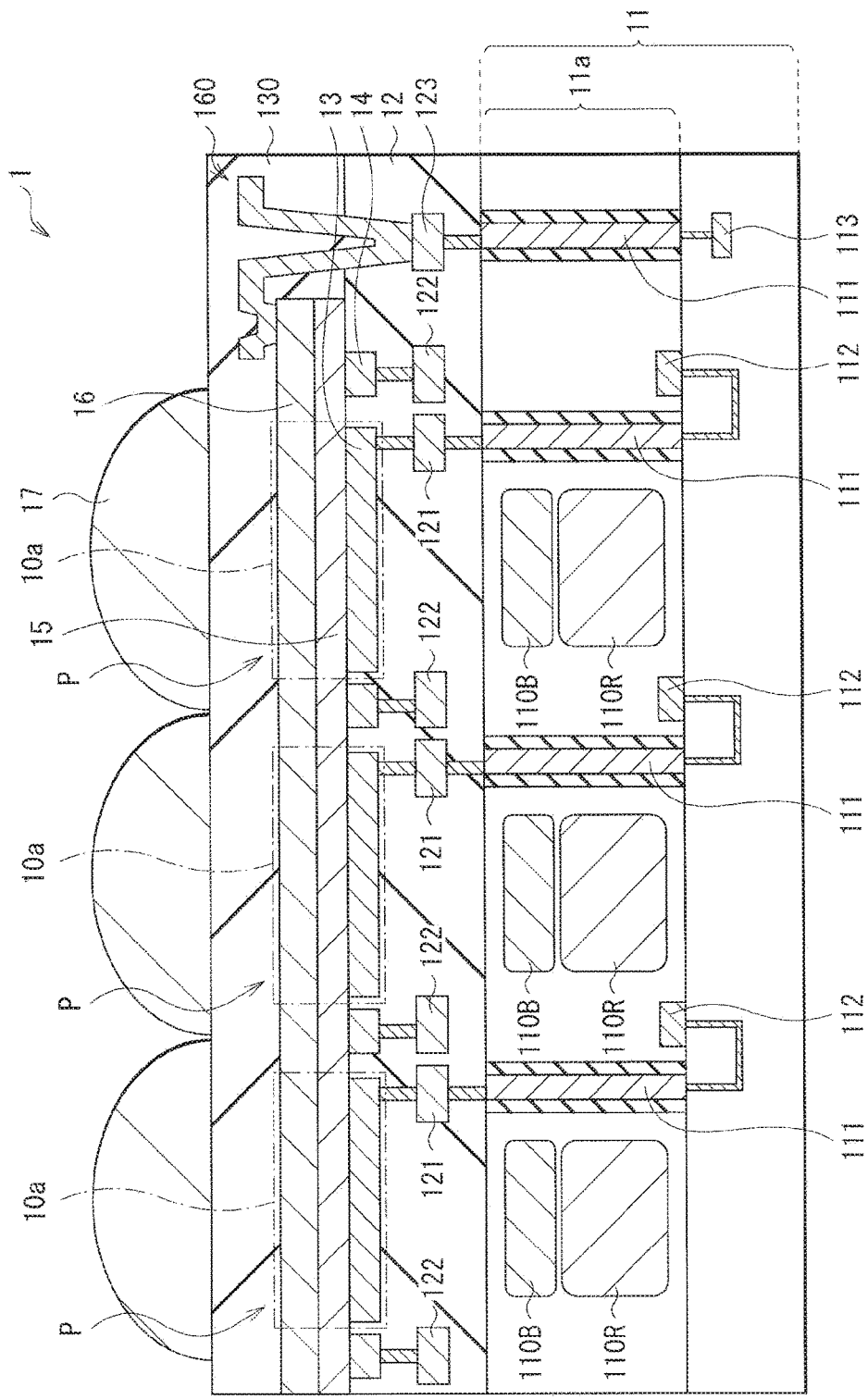

[FIG. 2]
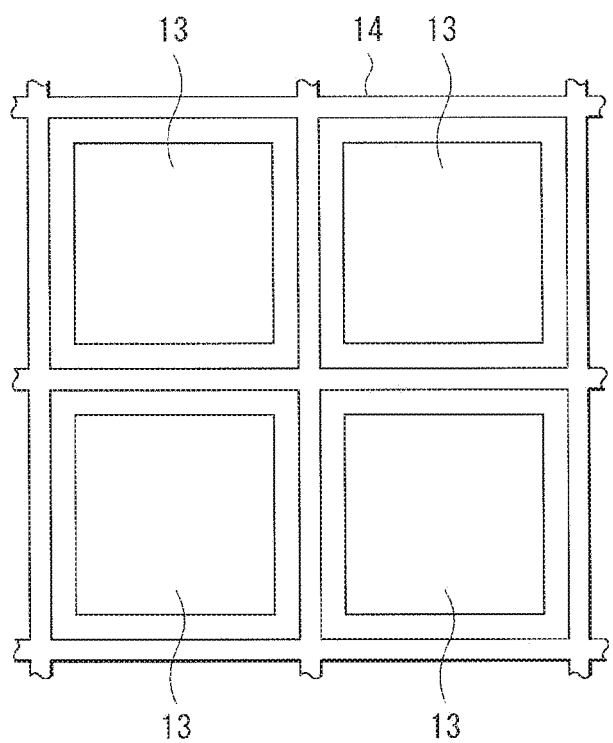

[ FIG. 3 ]
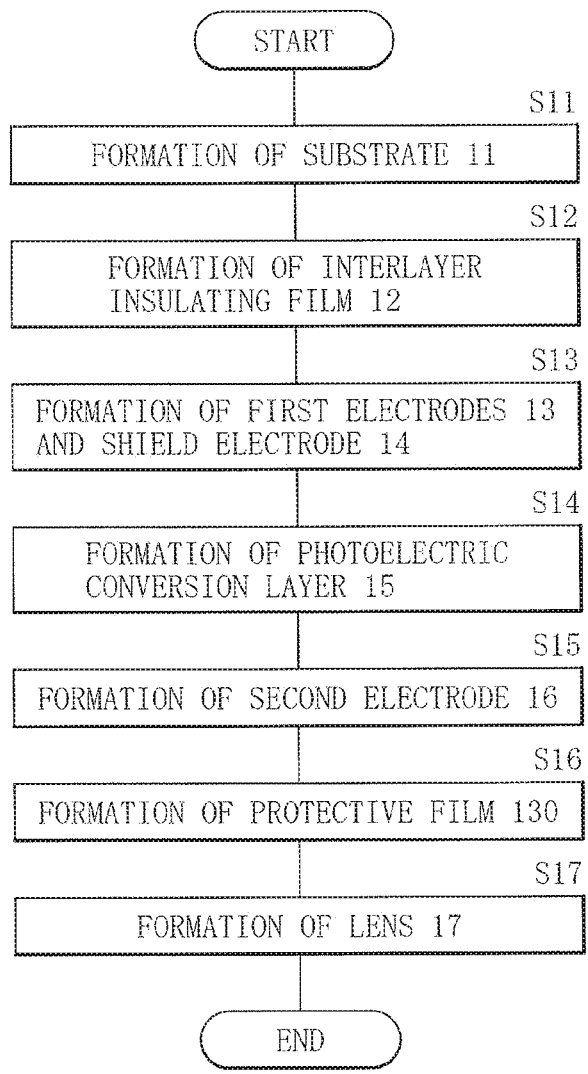

[ FIG. 4 ]
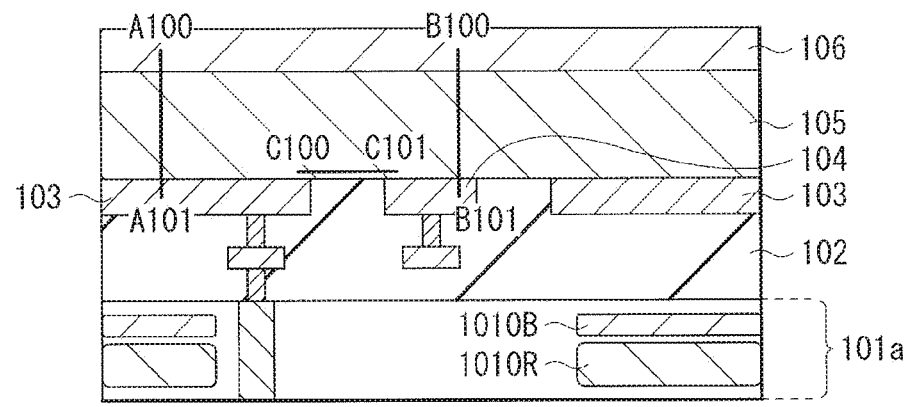
[ FIG. 5A ]
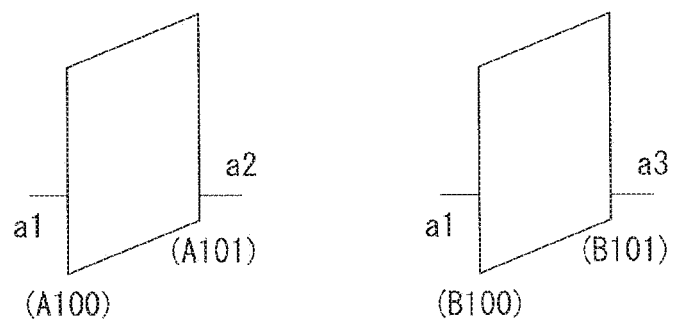
[ FIG. 5B ]
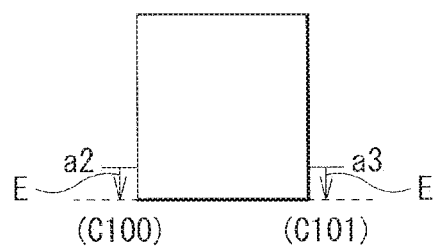

[ FIG. 6A ]
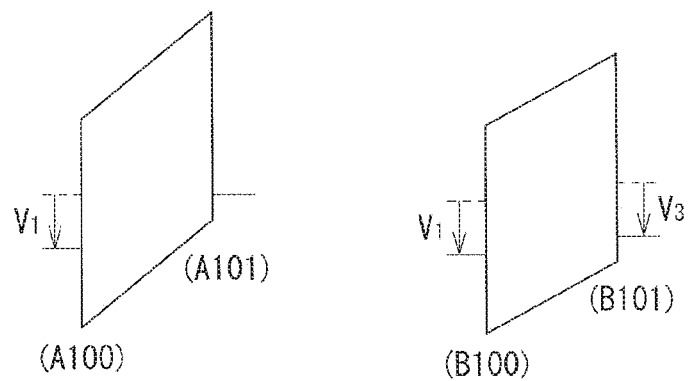
[ FIG. 6B ]
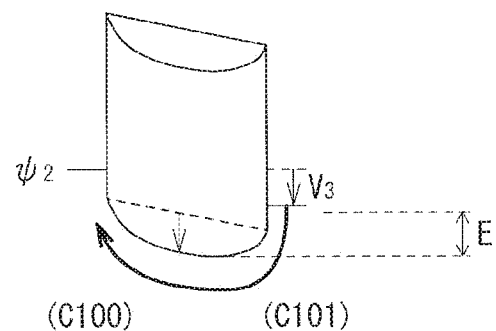

[ FIG. 7 ]
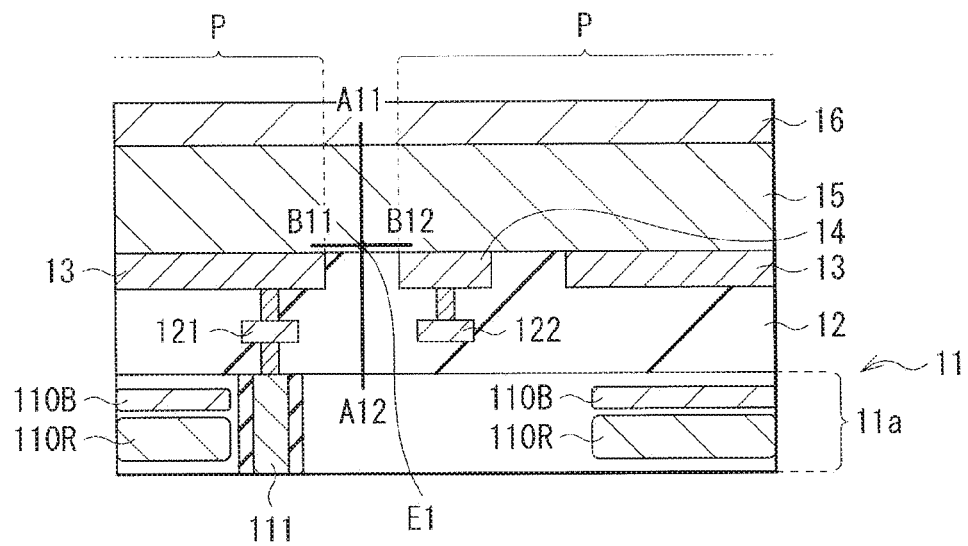
[ FIG. 8A ]
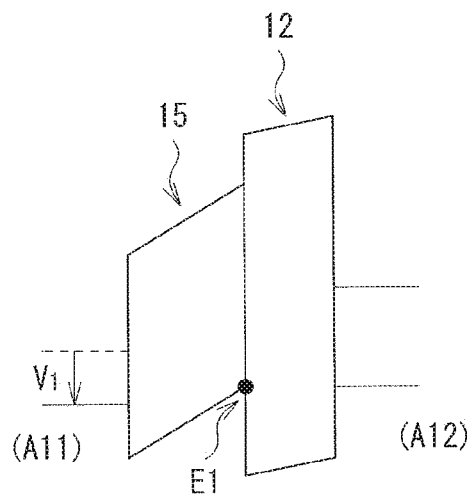
[ FIG. 8B ]
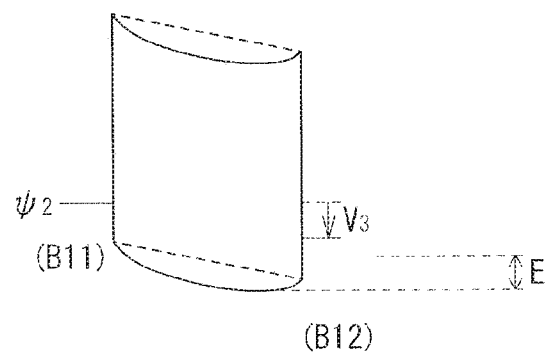

[ FIG. 9 ]
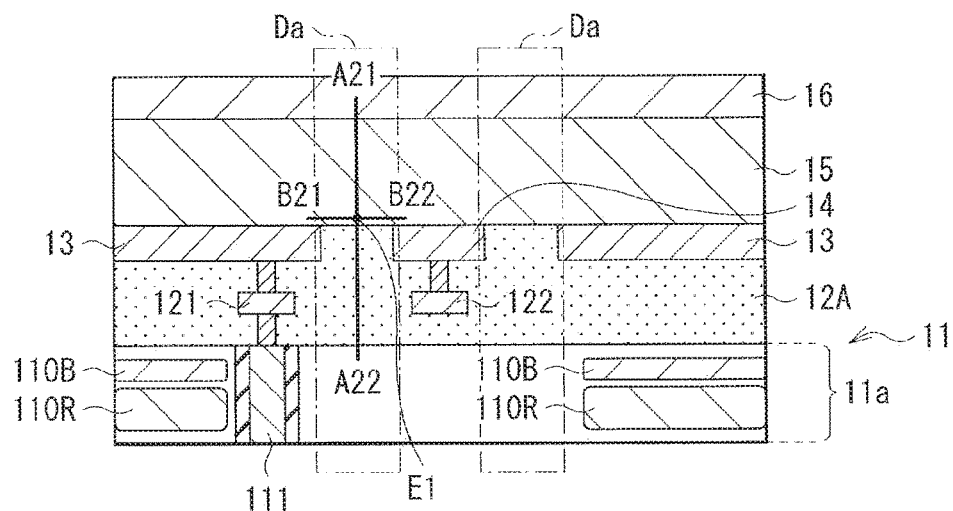
[ FIG. 10A ]
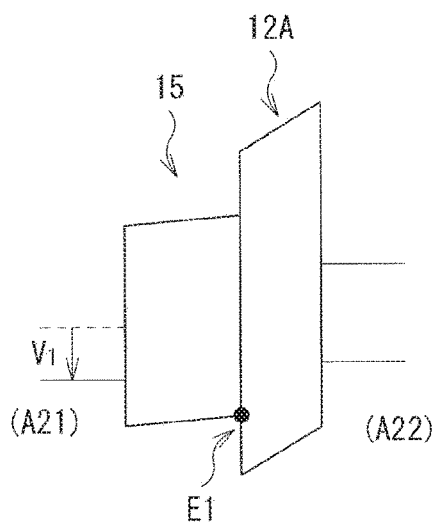
[ FIG. 10B ]
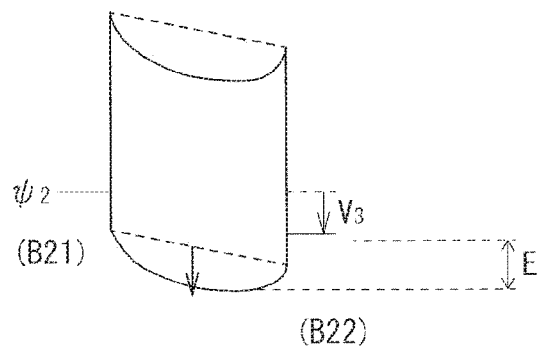

[ FIG. 11 ]
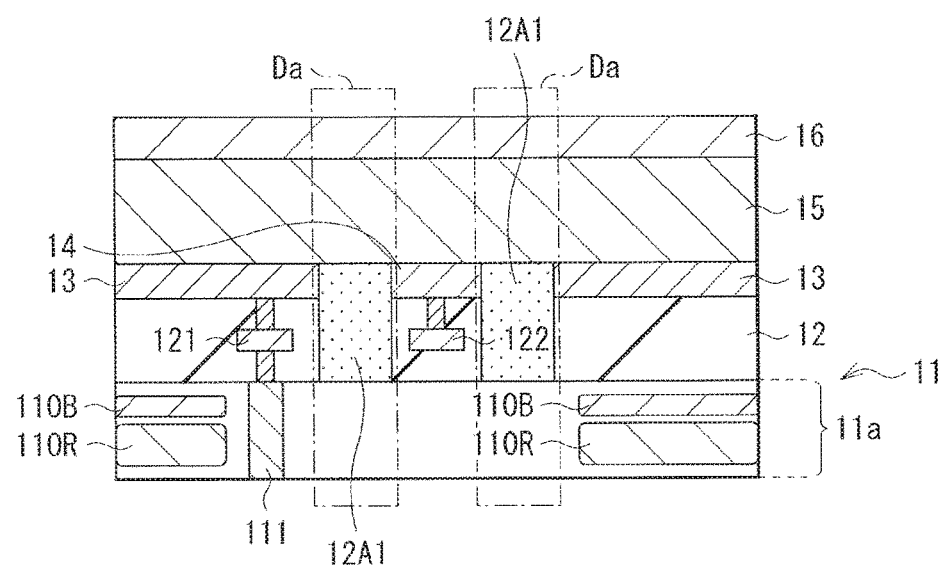
[ FIG. 12 ]
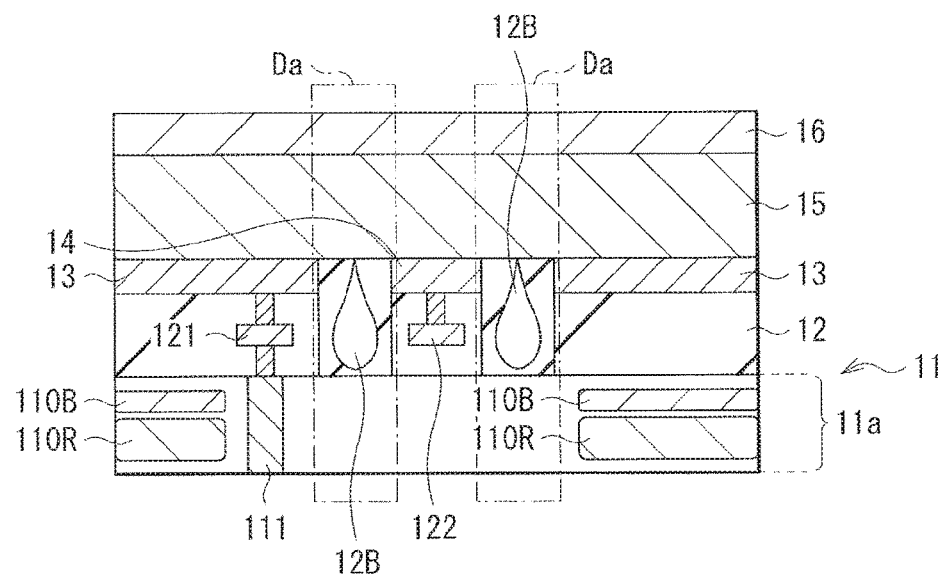

[FIG. 13]
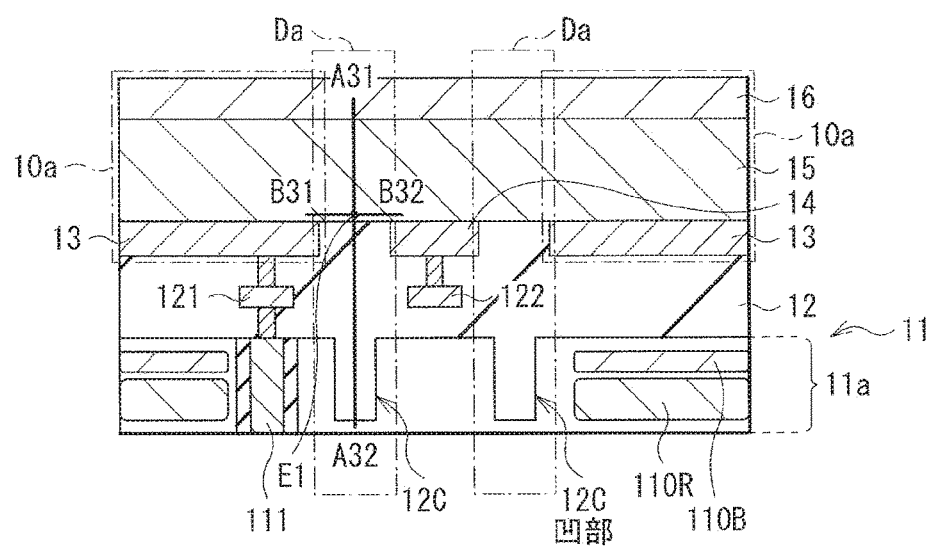

[ FIG. 14A ]
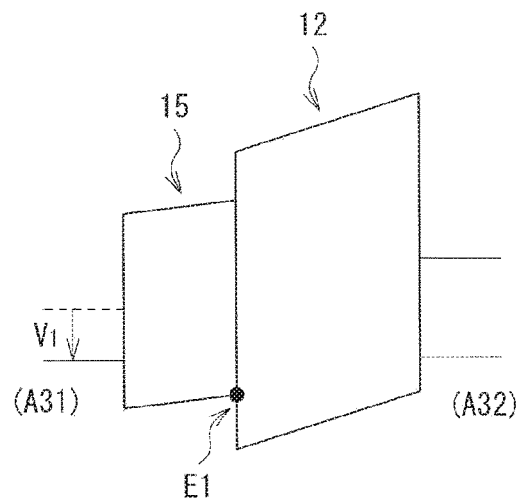
[ FIG. 14B ]
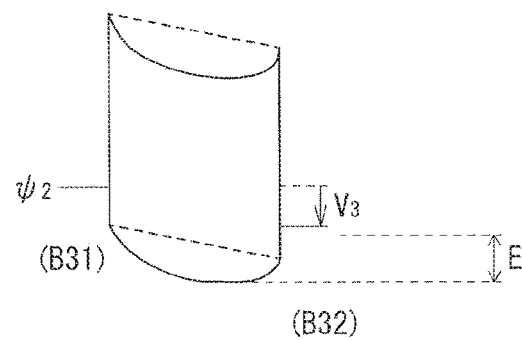
[ FIG. 15 ]
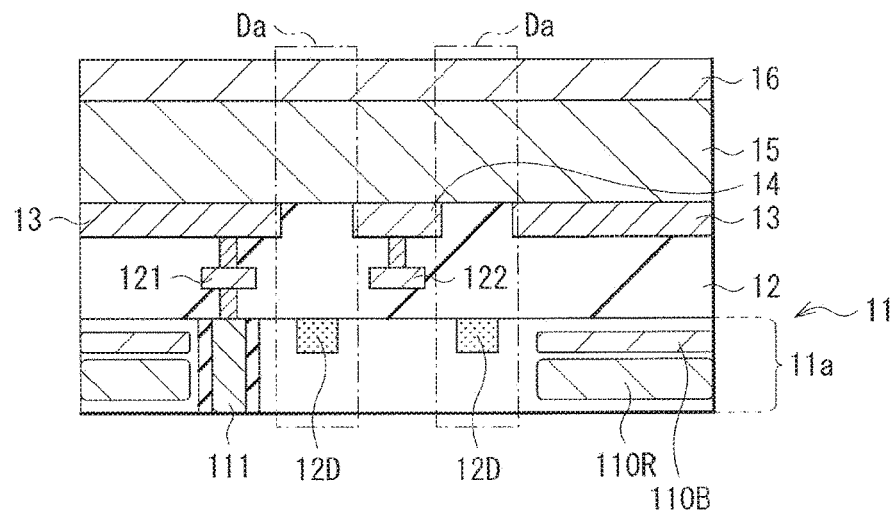

[ FIG. 16 ]
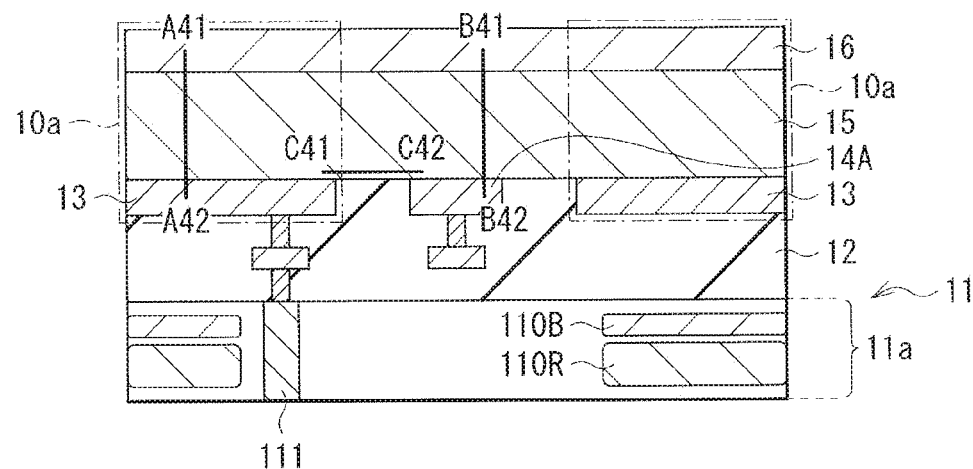
[ FIG. 17A ]
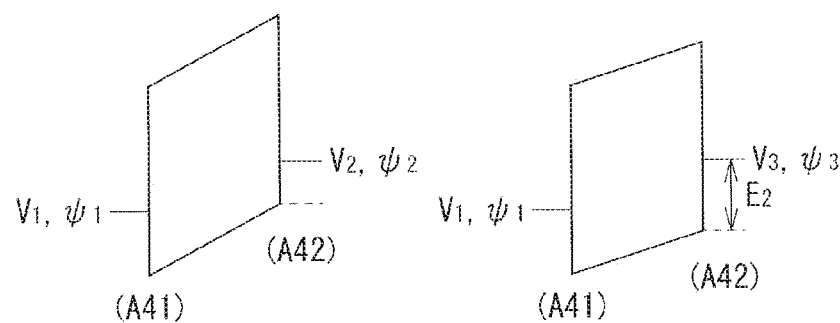
[ FIG. 17B ]
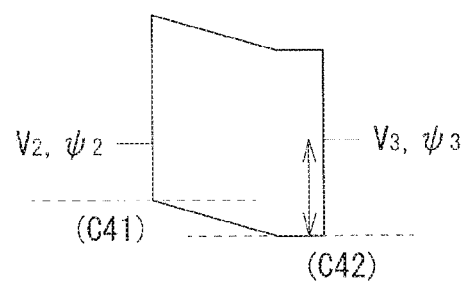

[FIG. 18]
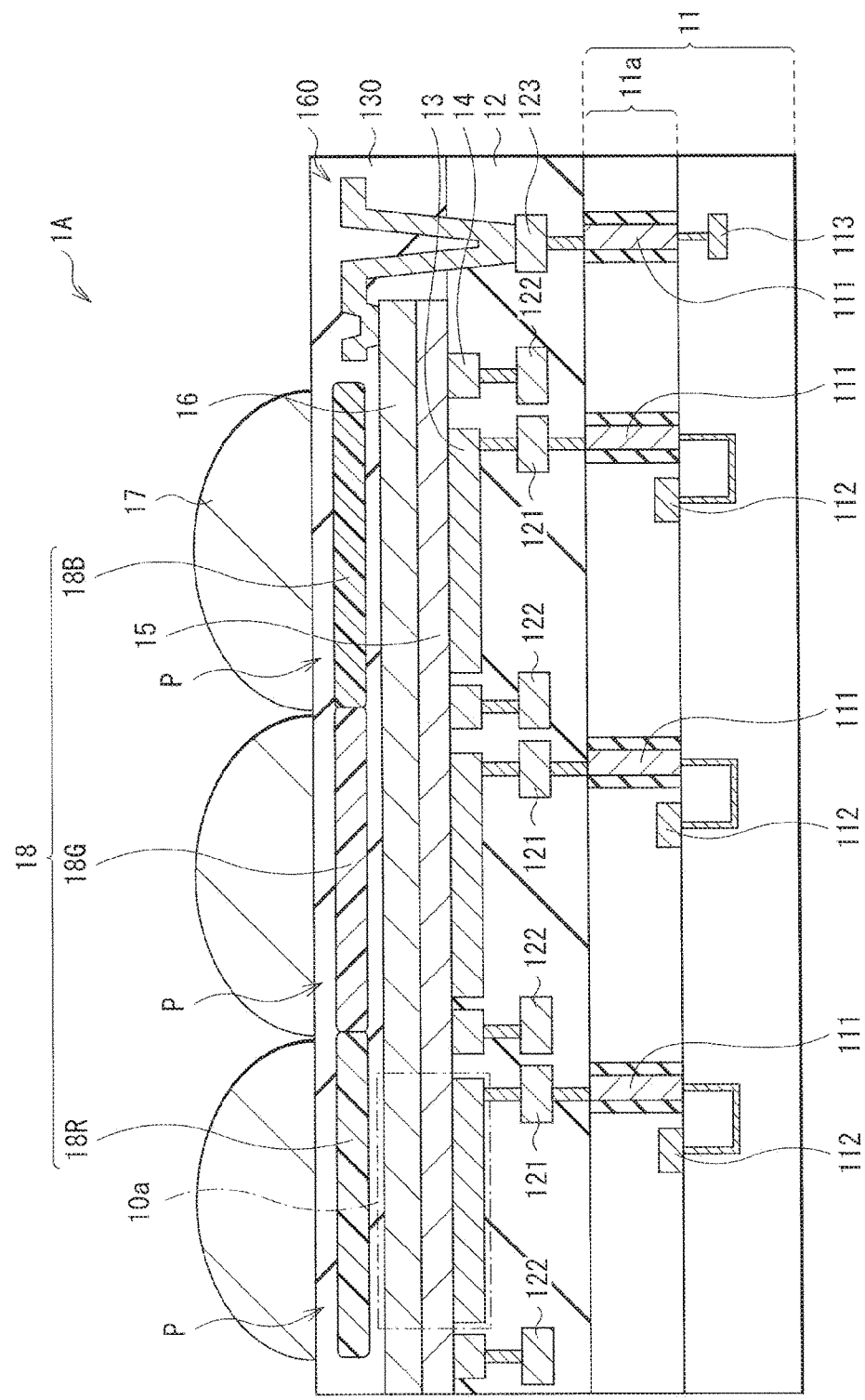

[ FIG. 19 ]
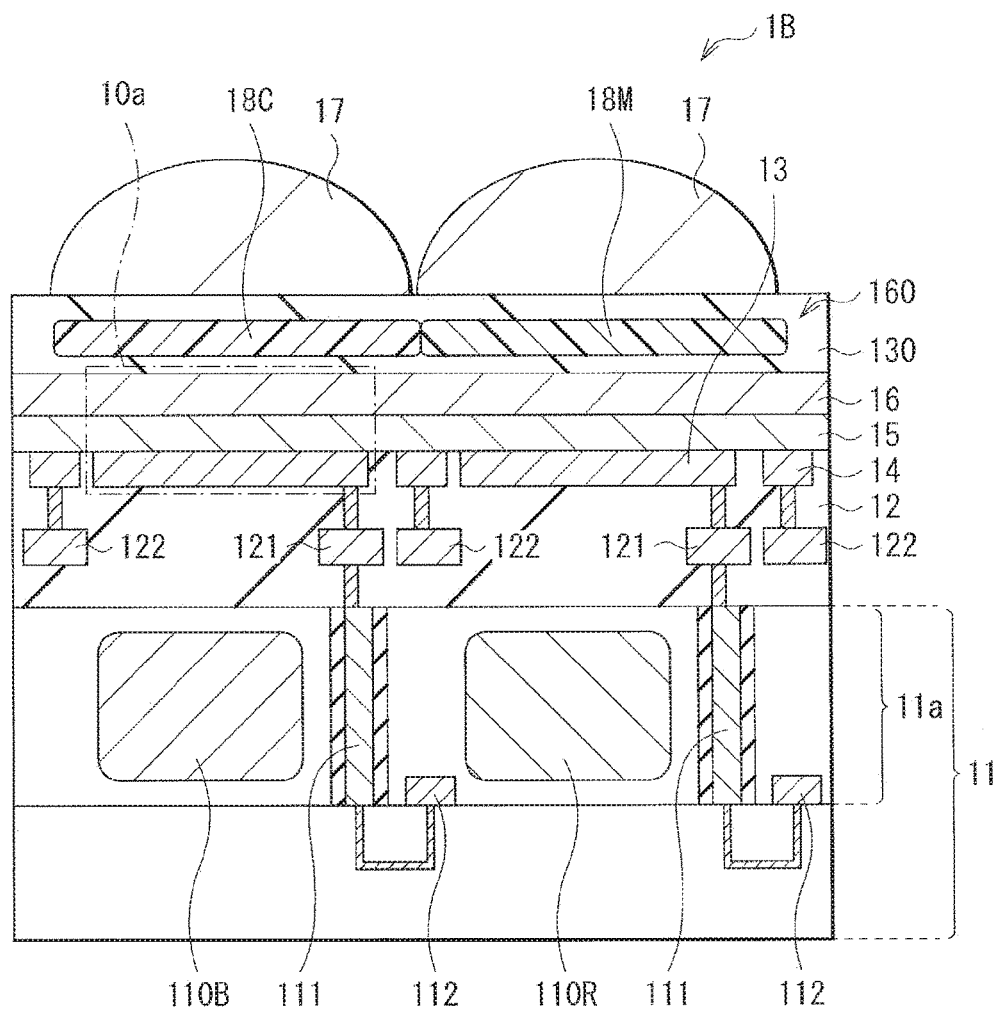

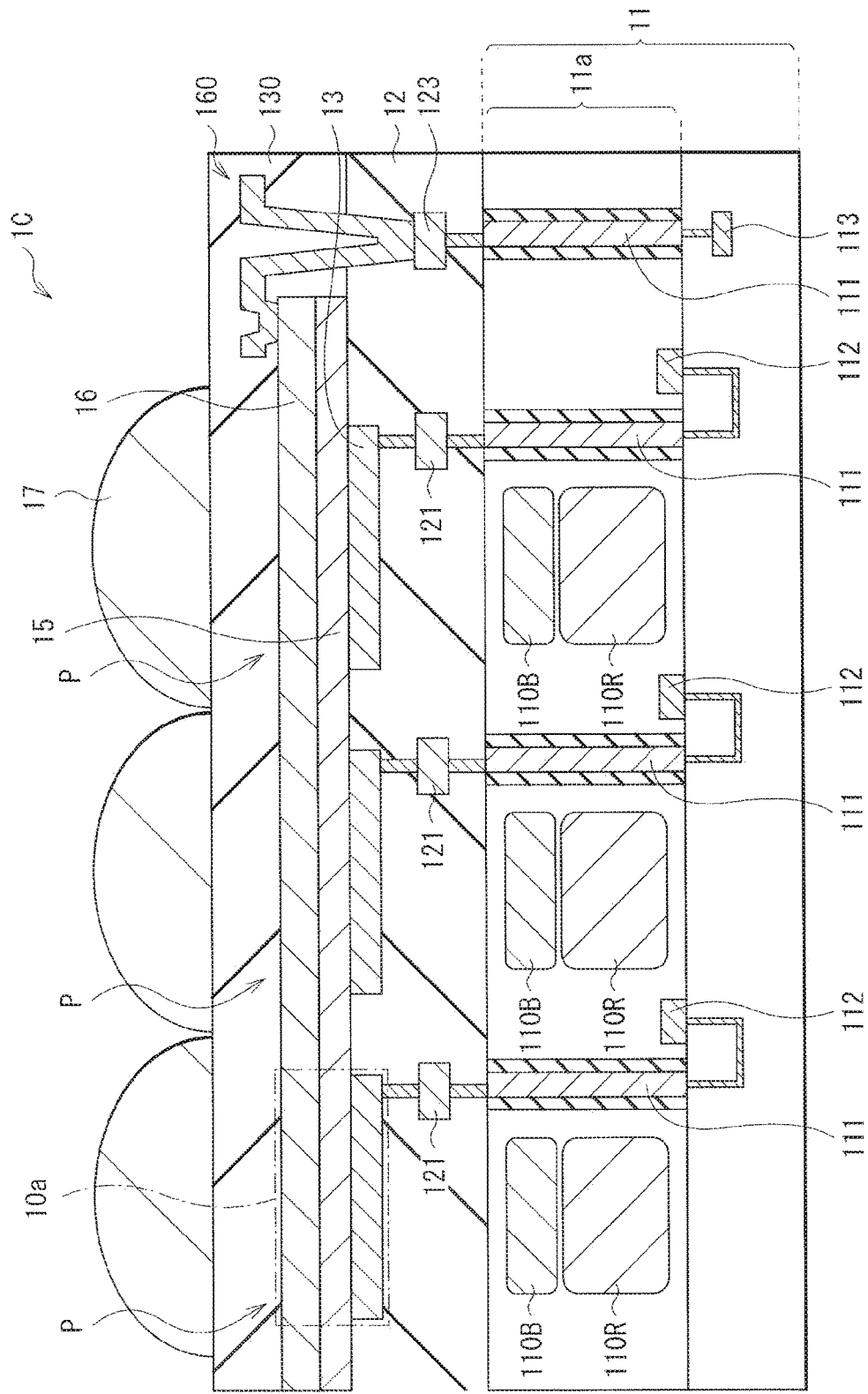
[FIG. 20]

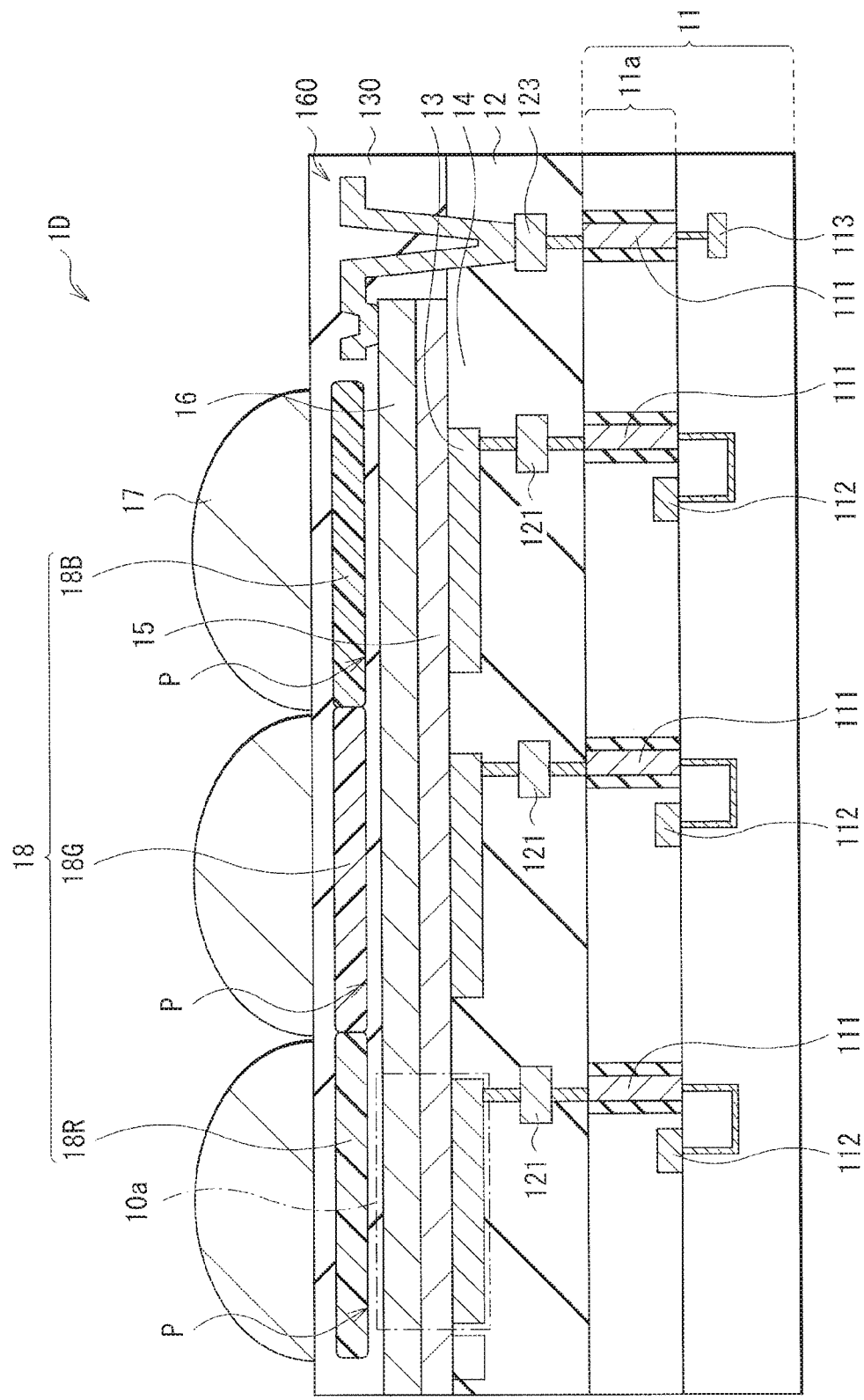
[FIG. 21]

[ FIG. 22 ]
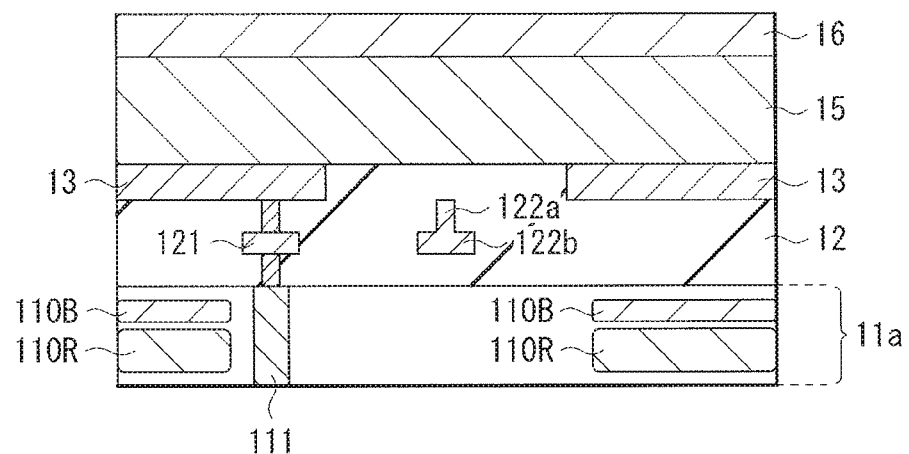

[FIG. 23]
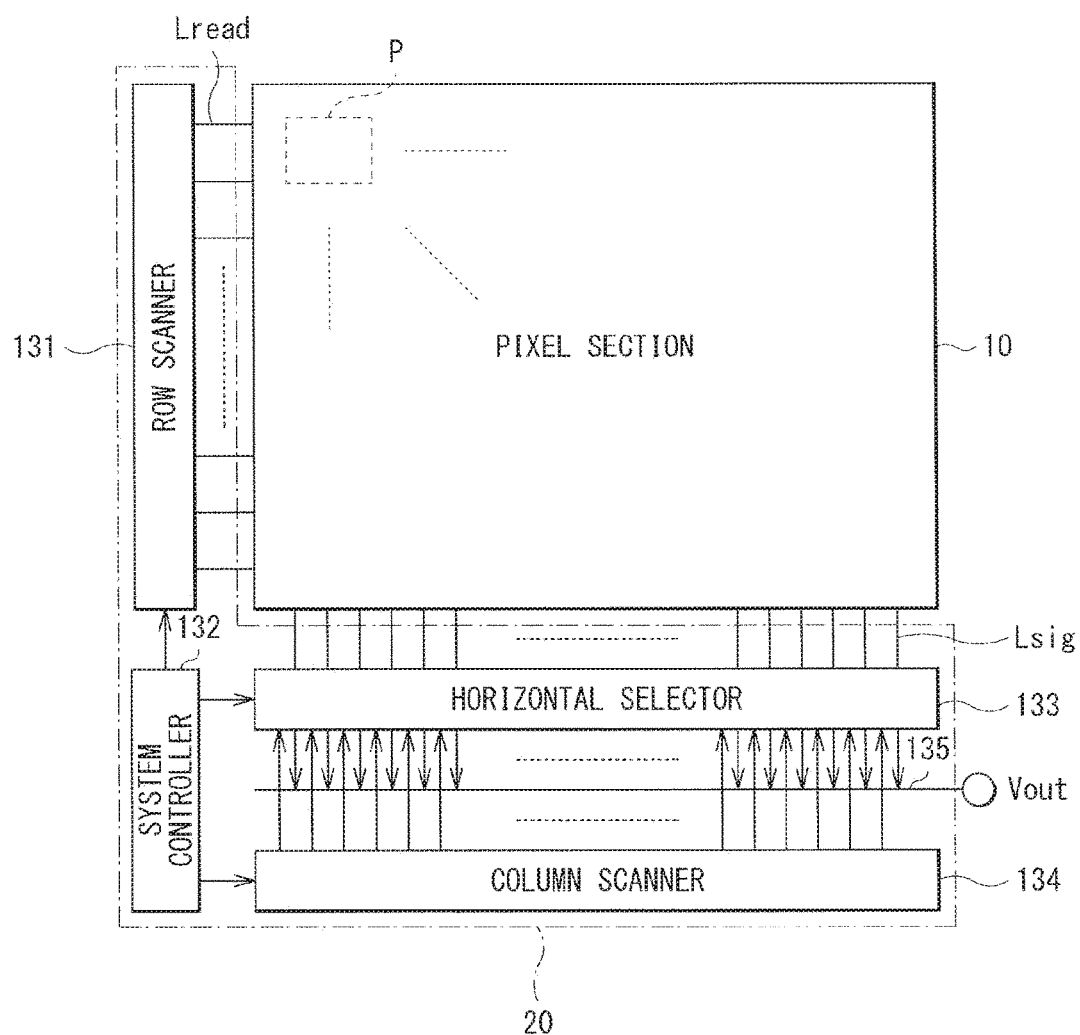

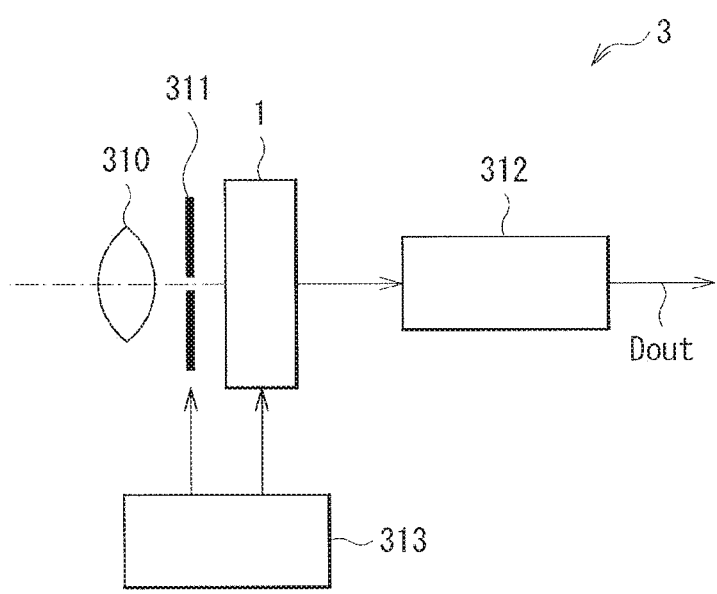
[ FIG. 24 ]

SOLID-STATE IMAGING DEVICE

CROSS REFERENCE TO RELATED APPLICATIONS

This application is a U.S. National Phase of International Patent Application No. PCT/JP2016/003580 filed on Aug. 3, 2016, which claims priority benefit of Japanese Patent Application No. JP 2015-158109 filed in the Japan patent office on Aug. 10, 2015. Each of the above-referenced applications is hereby incorporated herein by reference in its entirety.

TECHNICAL FIELD

The disclosure relates to a solid-state imaging device that uses an organic photoelectric conversion film, for example.

BACKGROUND ART

In recent years, a reduction in sensitivity in association with a reduction in pixel size has been a matter of concern in solid-state imaging devices such as CCD (Charge Coupled Device) and CMOS (Complementary Metal Oxide Semiconductor) image sensors. There is therefore proposed a solid-state imaging device that makes it possible to increase an aperture ratio of a photoelectric conversion region by forming a photoelectric conversion layer in an upper layer of a silicon substrate to achieve an improvement in sensitivity.

In such a solid-state imaging device, a photoelectric conversion film is provided between a pair of electrodes; however, in some cases, it is difficult to physically separate the photoelectric conversion film for each pixel. In this case, one or both of the pair of electrodes are physically separated for each pixel to allow for electrical element isolation without separating the photoelectric conversion film.

However, in this configuration, a distance between electrodes (hereinafter referred to as "pixel electrodes") separated for each pixel is decreased in association with the reduction in pixel size. Accordingly, when a potential difference arises between adjacent pixel electrodes, electrical leakage between adjacent pixels is caused by capacitive coupling through the photoelectric conversion film. The electrical leakage causes crosstalk of signals between the adjacent pixels.

There is a technique of suppressing the crosstalk. In the technique, a wire for potential control and an insulating film are provided between adjacent pixel electrodes, and a potential barrier in a photoelectric conversion film is increased by an electric field effect of the wire for potential control to suppress leakage. Moreover, there is proposed a technique of decreasing capacitive coupling between pixel electrodes by providing a shield wire between adjacent pixels.

SUMMARY

Technical Problem

In the technique that uses a wire for potential control, manufacturing processes are complicated, and the number of processes is increased. Moreover, in a case in which a shield electrode is used, a leakage current is generated between the pixel electrode and the shield electrode in some cases. It is therefore desirable to suppress crosstalk of signals caused by the leakage current between adjacent pixels or any other factor with use of a technique different from the previously known techniques.

It is therefore desirable to provide a solid-state imaging device that makes it possible to suppress crosstalk of signals between adjacent pixels.

Solution to Problem

Embodiments of the present disclosure provide a solid-state imaging device, an electronic apparatus, and a method of forming an image sensor that each suppress or reduce crosstalk of signals between adjacent pixels. In particular, a substrate with at least a first photoelectric conversion element formed therein includes a region between adjacent pixels having a reduced dielectric constant. This region can include a low-dielectric constant material provided in a part of an interlayer insulating film. In accordance with further embodiments, this region can include an air gap. In accordance with still other embodiments, this region can include a substrate with a locally thin region that is filled with an interlayer insulating film.

According to embodiments of the present disclosure, a solid-state imaging device is provided. According to at least one aspect of the present disclosure, the solid-state imaging device includes a substrate, and at least a first photoelectric conversion element formed in the substrate. In addition, a locally thin region is formed in the substrate. An interlayer insulating film at the first side of the substrate extends into the locally thin region. A first electrode is provided at a side of the interlayer insulating film opposite the substrate. A second electrode is also provided. The device further includes a photoelectric conversion layer at least partially between the first electrode and the second electrode.

In accordance with further embodiments of the present disclosure, an electronic apparatus is provided. The electronic apparatus according to at least some aspects of the present disclosure includes a solid-state imaging device with a substrate and at least a first photoelectric conversion element formed in the substrate. A recesses is formed in the substrate that extends from a first side of the substrate towards a second side of the substrate. An interlayer insulating film is at the first side of the substrate, and extends into the recess. A first electrode is provided at a side of the interlayer insulating film opposite the substrate. A photoelectric conversion layer is on the first electrode. A second electrode is on the photoelectric conversion layer. The apparatus further includes a protective film on a side of the second electrode, opposite the photoelectric conversion layer, and a lens adjacent side of the protective film opposite the second electrode.

In accordance with still other embodiments of the present disclosure, a method of forming an image sensor is provided. The method according to at least some aspects of the present disclosure includes forming a substrate and forming a locally thin region in the substrate. An interlayer insulating film is formed over the substrate. The interlayer insulating film extends into the locally thin region. In addition, a first electrode is formed over the interlayer insulating film. A photoelectric conversion layer is formed on the first electrode, and a second electrode is formed on the photoelectric conversion layer.

It is to be understood that both the foregoing general description and the following detailed description are exemplary, and are provided to provide further explanation of the technology as claimed.

BRIEF DESCRIPTION OF DRAWINGS

FIG. 1 is a cross-sectional view of a configuration of a solid-state imaging device according to a first embodiment of the disclosure;

FIG. 2 is a schematic plan view of a layout of first electrodes and a shield electrode illustrated in FIG. 1;

FIG. 3 is a flow chart of a method of manufacturing the solid-state imaging device illustrated in FIG. 1;

FIG. 4 is a schematic cross-sectional view of a configuration of a solid-state imaging device according to a comparative example;

FIG. 5A is a potential diagram of cross-sections taken along a line A100-A101 and B100-B101 of FIG. 4;

FIG. 5B is a potential diagram of a cross-section taken along a line C100-C101 of FIG. 4;

FIG. 6A is a potential diagram of the cross-sections taken along the A100-A101 and the line B100-B101 upon voltage application;

FIG. 6B is a potential diagram of the cross-section taken along the line C100-C101 upon voltage application;

FIG. 7 is a schematic cross-sectional view for description of an outline of the solid-state imaging device illustrated in FIG. 1;

FIG. 8A is a potential diagram of a cross-section taken along a line A11-A12 of FIG. 7;

FIG. 8B is a potential diagram of a cross-section taken along a line B11-B12 of FIG. 7;

FIG. 9 is a schematic cross-sectional view of a configuration example of the solid-state imaging device illustrated in FIGS. 1 and 7;

FIG. 10A is a potential diagram of a cross-section taken along a line A21-A22 of FIG. 9;

FIG. 10B is a potential diagram of a cross-section taken along a line B21-B22 of FIG. 9;

FIG. 11 is a schematic cross-sectional view of a main part configuration of a solid-state imaging device according to a modification example 1-1;

FIG. 12 is a schematic cross-sectional view of a main part configuration of a solid-state imaging device according to a modification example 1-2;

FIG. 13 is a schematic cross-sectional view of a main part configuration of a solid-state imaging device according to a second embodiment of the disclosure;

FIG. 14A is a potential diagram of a cross-section taken along a line A31-A32 of FIG. 13;

FIG. 14B is a potential diagram of a cross-section taken along a line B31-B32 of FIG. 13;

FIG. 15 is a schematic cross-sectional view of a main part configuration of a solid-state imaging device according to a modification example 2;

FIG. 16 is a schematic cross-sectional view of a main part configuration of a solid-state imaging device according to a third embodiment of the disclosure;

FIG. 17A is a potential diagram of cross-sections taken along a line A41-A42 and a line B41-B42 of FIG. 16;

FIG. 17B is a potential diagram of a cross-section taken along a line C41-C42 of FIG. 16;

FIG. 18 is a cross-sectional view of a configuration of a solid-state imaging device according to a modification example 3;

FIG. 19 is a cross-sectional view of a configuration of a solid-state imaging device according to a modification example 4;

FIG. 20 is a cross-sectional view of a configuration of a solid-state imaging device according to a modification example 5-1;

FIG. 21 is a cross-sectional view of a configuration of a solid-state imaging device according to a modification example 5-2;

FIG. 22 is a cross-sectional view of a configuration of a solid-state imaging device according to a modification example 5-3;

FIG. 23 is a block diagram of an overall configuration of an imaging unit including the solid-state imaging device; and FIG. 24 is a block diagram of an example of an electronic apparatus including the solid-state imaging device

DESCRIPTION OF EMBODIMENTS

Some embodiments of the disclosure are described in detail below with reference to drawings. It is to be noted that description is given in the following order.
1. First Embodiment (An example of a solid-state imaging device in which a low-dielectric constant material is used for an interlayer insulating film)
2. Modification Example 1-1 (An example in which a part of the interlayer insulating film includes a low-dielectric constant layer)
3. Modification Example 1-2 (An example in which the interlayer insulating film has an air gap)
4. Second Embodiment (An example of a solid-state imaging device in which one surface of a substrate has a recess to vary a thickness of the interlayer insulating film)
5. Modification Example 2 (An example in which a low carrier density region is provided on one surface side of the substrate)
6. Third Embodiment (An example of a solid-state imaging device including a shield electrode having a work function that is different from a first electrode)
7. Modification Example 3 (An example of a solid-state imaging device using a color filter layer)
8. Modification Example 4 (An example of another solid-state imaging device using a color filter layer)
9. Modification Examples 5-1 to 5-3 (An example without providing a shield electrode)
10. Application Example 1 (An overall functional configuration example of an imaging unit)
11. Application Example 2 (An example of an electronic apparatus (e.g., a camera))

(First Embodiment)
[Configuration]

FIG. 1 illustrates a cross-sectional configuration of a solid-state imaging device (a solid-state imaging device 1) according to a first embodiment of the disclosure. The solid-state imaging device 1 may be applied to, for example, a CCD and a CMOS image sensor. It is to be noted that FIG. 1 illustrates a region corresponding to three pixels in a pixel section (a pixel section 10 illustrated in FIG. 23) to be described later.

In the solid-state imaging device 1, a plurality of photoelectric conversion elements 10a are formed on a substrate 11 with an interlayer insulating film 12 in between. A protective film (or a planarization film) 130 is formed on these photoelectric conversion elements 10a (on a second electrode 16). An on-chip lens (a lens 17) is formed for each pixel P on the protective film 130.

The solid-state imaging device 1 has a configuration in which photoelectric conversion elements are stacked in a vertical direction. The photoelectric conversion elements selectively detect light in wavelength ranges different from one another to perform photoelectric conversion on the thus-detected light. More specifically, in the solid-state imaging device 1, for example, the photoelectric conversion elements 10a (organic photoelectric conversion elements) may be provided on the substrate 11, and, for example, two photoelectric conversion elements 110B and 110R (photodiodes) may be formed in the substrate 11. A stacked configuration of the photoelectric conversion elements 10a, 110B, and 110R makes it possible to separate light of different colors without using a color filter to obtain a plurality of kinds of color signals from one pixel P. Non-limiting examples of the colors may include red (R), green (G), and blue (B).

The substrate 11 may be made of, for example, a semiconductor (an electric conductor) such as silicon (Si). For example, the photoelectric conversion elements 110B and 110R are so formed as to be embedded in a layer (a silicon layer 11a) on top surface side of the substrate 11. The interlayer insulating film 12 is disposed on a top surface of the substrate 11, and a second electrode 16 with a photoelectric conversion layer 15 to be described later is disposed on the interlayer insulating film 12. In the embodiment, in a part or the entirety of a region corresponding to a gap between first electrodes 13 (a region in which the first electrodes 13 are not disposed, i.e., a region that does not oppose the first electrodes 13), a part of the substrate 11 (a part of the silicon layer 11a) opposes the second electrode 16 and is electrically coupled (capacitively coupled) to the second electrode 16. The photoelectric conversion elements 110B and 110R each may be a photodiode having a PN junction, for example. The photoelectric conversion elements 110B and 110R are formed in this order from a light entry side of a respective pixel P. As driving elements for reading of signals from the photoelectric conversion elements 10a, 110B, and 110R, for example, a plurality of pixel transistors may be provided on a circuit formation surface of the substrate 11. Specific but non-limiting examples of the pixel transistors may include a transfer transistor (TRF), a reset transistor (RST), an amplifier transistor (AMP), and a selection transistor (SEL).

The photoelectric conversion element 110B may selectively absorb, for example, blue light (in a wavelength range of about 450 nm to about 495 nm both inclusive, for example) to generate electric charges. The photoelectric conversion element 110R may selectively absorb, for example, red light (in a wavelength range of about 620 nm to about 750 nm both inclusive, for example) to generate electric charges. The photoelectric conversion elements 110B and 110R each are coupled to the foregoing transfer transistor through a floating diffusion (FD) (not shown).

A charge accumulation layer 112 is formed in the substrate 11. The charge accumulation layer 112 accumulates signal charges generated by each of the photoelectric conversion elements 10a. The charge accumulation layer 112 may be, for example, one of an n-type impurity diffused layer and a p-type impurity diffused layer, and is electrically coupled to the first electrode 13. More specifically, the charge accumulation layer 112 and the first electrode 13 are coupled to each other through a through wiring 111, a wiring layer 121, and any other component. The signal charges collected in the first electrode 13 are transferred to the substrate 11.

In the interlayer insulating film 12, wiring layers 121 and 122, and any other component are formed over one or more layers. A plurality of photoelectric conversion elements 10a (first electrodes 13) are disposed on the interlayer insulating film 12. The interlayer insulating film 12 may be one of a single-layer film and a multi-layered film including two or more layers. In the embodiment, the interlayer insulating film 12 is adapted to increase a charge barrier between adjacent first electrodes 13 as will be described in detail later.

(Photoelectric Conversion Element 10a)

Each of the photoelectric conversion elements 10a may be an organic photoelectric conversion element that absorbs light of a selective wavelength (for example, green light of a wavelength of about 495 nm to about 570 nm both inclusive) with use of, for example, an organic semiconductor to generate electron-hole pairs. The photoelectric conversion element 10a has a configuration in which a photoelectric conversion layer 15 is sandwiched between the first electrode 13 and the second electrode 16 as a pair of electrodes for extraction of electric charges. The photoelectric conversion layer 15 is provided as a continuous film shared by all pixels P. A plurality of first electrodes 13 are provided, with each first electrode 13 corresponding to a respective pixel P. A photoelectric conversion region is electrically separated for each of the pixels P by discrete arrangement of the first electrodes 13 (separation of the pixel electrodes). In the embodiment, a shield electrode 14 (a third electrode) may be provided in a gap between adjacent first electrodes 13 (in a region in which the first electrodes 13 are not formed) on the interlayer insulating film 12. Respective components will be described in detail below.

The first electrodes 13 are provided for respective pixels, and electric charges (for example, holes or electrons; photoelectric conversion carriers) are read out as signal charges through the first electrodes 13. The first electrodes 13 each are electrically coupled to the charge accumulation layer 112 formed in the substrate 11 as described above. Here, the first electrodes 13 each are configured of a conductive film having light transparency (a transparent conductive film). The transparent conductive film may be made of, for example, indium tin oxide (ITO). In addition to ITO, a tin oxide ($SnO_2$)-based material doped with a dopant, or a zinc oxide (ZnO)-based material in which zinc oxide is doped with a dopant may be used as a material of the first electrodes 13. Non-limiting examples of the zinc oxide-based material may include aluminum zinc oxide (AZO) in which aluminum is added as a dopant, gallium zinc oxide (GZO) in which gallium (Ga) is added as a dopant, indium zinc oxide (IZO) in which indium (In) is added as a dopant. In addition to the foregoing materials, non-limiting examples used as the material of the first electrodes 13 may include CuI, $InSbO_4$, ZnMgO, $CuInO_2$, $MgIn_2O_4$, CdO, and $ZnSnO_3$.

The shield electrode 14 may be made of one of the same material as the material of the first electrodes 13 and a material different from the material of the first electrodes 13, for example. In the embodiment, while the first electrodes 13 are made of a material having light transparency, the shield electrode 14 may have light transparency or may not have light transparency. The shield electrode 14 may be made of a material not having light transparency, for example, a metal such as aluminum (Al) and tungsten (W).

FIG. 2 illustrates planar configurations of the first electrodes 13 and the shield electrode 14. The shield electrode 14 is disposed so as to surround the first electrodes 13 in a plane. For example, in a case in which the first electrodes 13 are two-dimensionally arranged in a matrix on the interlayer insulating film 12, the shield electrode 14 may be disposed in a lattice pattern as a whole, for example.

The photoelectric conversion layer 15 is adapted to perform photoelectric conversion of light of a selective wavelength (for example, green), and may preferably include one or both of a p-type organic semiconductor and an n-type organic semiconductor. For example, one or more selected from quinacridone, naphthalene, anthracene, phenanthrene, tetracene, pyrene, perylene, fluoranthene and other organic semiconductors (and derivatives of all of the foregoing organic semiconductors) may be used as the organic semiconductor. Alternatively, one or more selected from phenylenevinylene, fluorene, carbazole, indole, pyrene, pyrrole, picoline, thiophene, acetylene, and diacetylene, or a copolymer or a derivative thereof may be used. In addition, a dye may be used. Non-limiting examples of the dye may include a metal complex dye, a cyanine-based dye, a merocyanine-based dye, a phenylxanthene-based dye, a triphenylmethane-based dye, a rhodacyanine-based dye, a xanthene-based dye, a macrocyclic azaannulene-based dye, an azulene-based dye, a naphthoquinone-based dye, and an anthraquinone-based dye. It is to be noted that non-limiting examples of the metal complex dye may include a dithiol metal complex-based dye, a metal phthalocyanine dye, a metal porphyrin dye, and a ruthenium complex dye.

It is to be noted that any other unillustrated layer may be provided each between the photoelectric conversion layer 15 and the first electrodes 13 and between the photoelectric conversion layer 15 and the second electrode 16. For example, an electron blocking film, a hole blocking film, a work function adjustment film, or any other film may be formed as necessary.

The second electrode 16 may be configured as a conductive film having light transparency (a transparent conductive film). The transparent conductive film may be made of, for example, indium tin oxide (ITO). In addition to ITO, a tin oxide ($SnO_2$)-based material doped with a dopant, or a zinc oxide (ZnO)-based material in which zinc oxide is doped with a dopant may be used as a material of the second electrode 16. Non-limiting examples of the zinc oxide-based material may include aluminum zinc oxide (AZO) in which aluminum is added as a dopant, gallium zinc oxide (GZO) in which gallium (Ga) is added as a dopant, and indium zinc oxide (IZO) in which indium (In) is added as a dopant. In addition to the foregoing materials, non-limiting examples used as the material of the second electrode 16 may include CuI, $InSbO_4$, ZnMgO, $CuInO_2$, $MgIn_2O_4$, CdO, and $ZnSnO_3$. It is to be noted that in a case in which electric charges extracted from the first electrodes 13 are read out as signals, electric charges extracted from the second electrode 16 are discharged. Accordingly, the second electrode 16 is continuously formed as a common electrode shared by the pixels P. Alternatively, the second electrode 16 may be separated for each of the pixels P.

FIG. 3 is a flow chart for description of a method of manufacturing the solid-state imaging device 1 as described above. The solid-state imaging device 1 is able to be manufactured through respective processes in order. The processes include formation of the substrate 11 (step S11), formation of the interlayer insulating film 12 (step S12), formation of the first electrodes 13 and the shield electrode 14 (step S13), formation of the photoelectric conversion layer 15 (step S14), formation of the second electrode 16 (step S15), formation of the protective film 130 (step S16), and the formation of the lens 17 (step S17).

[Main Part Configuration and Workings]

In the solid-state imaging device 1 according to the embodiment, a charge (potential) barrier (a barrier E) generated between the first electrode 13 and the shield electrode 14 by voltage application to the second electrode 16 is increased.

In the following, with reference to FIGS. 4 to 6B, description is given of a cause of generation of a leakage current between the shield electrode and the first electrode. FIGS. 4 to 6B are a cross-sectional view and potential diagrams of a solid-state imaging device according to a comparative example. FIGS. 5A and 5B illustrate a state in which a bias voltage is not applied to an electrode or any other component. FIGS. 6A and 6B illustrate a state in which a bias voltage is applied to the electrode and any other component (a driving state). In the solid-state imaging device, a first electrode 103, a photoelectric conversion layer 105, and a second electrode 106 are formed on a silicon layer 101a with an interlayer insulating film 102 in between. The silicon layer 101a includes photoelectric conversion elements 101B and 101R. A shield electrode 104 is provided in a gap between the first electrodes 103 on the interlayer insulating film 102. It is to be noted that in this case, holes are collected as signal charges in the first electrodes 103. In a case in which electrons are collected as the signal charges in the first electrodes 103, the magnitude relation of work functions and the polarity of the bias voltage are reversed.

The first electrodes 103 and the shield electrode 104 may be made of, for example, a material having a same work function. The second electrode 106 is made of a material having a smaller work function than the work function of the first electrodes 103. An inner electric field is therefore easily generated. In the inner electric field, holes easily flow from the second electrode 106 to the first electrode 103. In this configuration, since the shield electrode 104 and the first electrodes 103 have the same work function, in the state in which the bias voltage is not applied (a state in which a potential a1 of the second electrode 106, a potential a2 of the first electrode 103, and a potential a3 of the shield electrode 104 are equal to one another) as illustrated in FIG. 5A, the barriers E against holes to the photoelectric conversion layer 105 of the first electrode 103 and the shield electrode 104 become equal as illustrated in FIG. 5B.

In contrast, consideration is given to the driving state in which the voltage is applied to the second electrode 106 and the shield electrode 104 (a state in which a potential of the second electrode 106 is V1 and a potential of the shield electrode 104 is V3) as illustrated in FIG. 6A. In this state, a positive (plus) voltage is so applied to the second electrode 106 as to allow holes to flow from the second electrode 106 to the first electrode 103. Moreover, a voltage of the same polarity (plus) as the polarity of the voltage applied to the second electrode 106 is so applied to the shield electrode 104 so as not to reduce the number of holes collected in the first electrode 103 by the flow of holes into the shield electrode 104. Under such a voltage application state, an electric field is generated in a direction in which holes flow from the shield electrode 104 to the first electrode 103 and electrons flow from the first electrode 103 to the shield electrode 104. This easily causes leakage between the first electrode 103 and the shield electrode 104. Moreover, in the photoelectric conversion layer 105 between the first electrode 103 and the shield electrode 104, the barrier E against the holes is increased by the potential V1 of the second electrode 106 to suppress a hole current. It is to be noted that in order to collect holes out of photoelectric conversion carriers in the first electrode 103, it is assumed that a material having a large work function is used for the first electrode 103. Accordingly, in a leakage current component, a hole current is dominant.

On the basis of the foregoing mechanism, in order to suppress the leakage current, it is desirable to increase the barrier E by voltage application to the second electrode 106. The barrier E against holes flowing from the shield electrode 104 to the first electrode 103 is increased by an electric field generated by voltage application to the second electrode 106.

Hence, in the solid-state imaging device 1 according to the embodiment, the interlayer insulating film 12 is configured as follows. In order to further increase the barrier E generated by voltage application to the second electrode 16, the solid-stage imaging device 1 is configured so as to reduce a voltage drop more on the photoelectric conversion layer 15 side in consideration of capacities of the photoelectric conversion layer 15 and the interlayer insulating film 12 formed below the photoelectric conversion layer 15.

FIG. 7 is a schematic cross-sectional view for description of an outline of the solid-state imaging device 1 according to the embodiment. FIG. 8A is a potential diagram of a cross-section passing through the second electrode 16, the photoelectric conversion layer 15, the interlayer insulating film 12, and the substrate 11 (a cross-section taken along a line A11-A12) between the first electrode 13 and the shield electrode 14. FIG. 8B is a potential diagram of a cross-section taken along a line B11-B12.

First, when the potential V1 and the potential V3 are respectively applied to the second electrode 16 and the shield electrode 14, the potential V1 is distributed to the photoelectric conversion layer 15 and the interlayer insulating film 12 as illustrated in FIG. 8A. A potential at a point (an intersection point between the line A11-A12 and the line B11-B12) E1 as a boundary between the photoelectric conversion layer 15 and the interlayer insulating film 12 serves as the barrier E against holes in FIG. 8B. In other words, in FIG. 8A, it is more effective to suppress leakage when the potential at the point E1 is closer to the second electrode 16.

Moreover, a ratio of voltage distribution to the photoelectric conversion layer 15 and the interlayer insulating film 12 is determined, based on a ratio between the capacity of the photoelectric conversion layer 15 and the capacity of the interlayer insulating film 12. In other words, use of the interlayer insulating film 12 that makes it possible to minimize a voltage drop in the photoelectric conversion layer 15 is effective for suppression of leakage. In the embodiment, the configuration (such as a material, a thickness, and a stacking configuration) of the interlayer insulating film 12 is designed from this viewpoint.

FIG. 9 illustrates an example of the configuration of the interlayer insulating film 12. FIG. 9 is a schematic cross-sectional view of a main part configuration example of the solid-state imaging device 1. FIG. 10A illustrates a potential diagram of a cross-section (a cross-section taken along the line A21-A22) passing through the second electrode 16, the photoelectric conversion layer 15, the interlayer insulating film 12, and the substrate 11 between the first electrode 13 and the shield electrode 14. FIG. 10B illustrates a potential diagram of a cross-section taken along the line B21-B22. In this example, in a gap between the first electrodes 13, more specifically in a region (a region Da) corresponding to a gap between the first electrode 13 and the shield electrode 14, the substrate 11 (the silicon layer 11a) opposes the second electrode 16 with the interlayer insulating film 12 (the low-dielectric constant layer 12A) and the photoelectric conversion layer 15 in between. Accordingly, the substrate 11 is electrically coupled to the second electrode 16 in the region Da. As the interlayer insulating film 12, the low-dielectric constant layer 12A made of a low-dielectric constant (low relative dielectric constant) material (a Low-k material) may be formed on the substrate 11. In other words, the low-dielectric constant layer 12A may be formed on the entirety of the substrate 11. More specifically, the low-dielectric constant layer 12A may preferably have a relative dielectric constant of about 3.6 or less.

Examples of a material of the low-dielectric constant layer 12A may include a material in which silicon oxide ($SiO_x$) is mixed with one or more elements selected from carbon (C), hydrogen (H), fluorine (F), boron (B), and nitrogen (N). Alternatively, the low-dielectric constant layer 12A may be one of an organic film including one of carbon (C), nitrogen (N), oxygen (O), hydrogen (H), fluorine (F), and boron (B) in a composition, and a film having a pore. It is to be noted that the low-dielectric constant layer 12A illustrated here is a single-layer film, but the low-dielectric constant layer 12A may be a multi-layered film including two layers or three or more layers. Moreover, in a case with the multi-layered film, all of the layers may be made of the foregoing low-dielectric constant material, or only one or more layers selected from the layers may be made of the low-dielectric constant material. Even in a case in which the low-dielectric constant material is used for the selected layer or the selected layers only, it is possible to decrease the relative dielectric constant of the interlayer insulating film 12 as a whole.

The voltage drop in the photoelectric conversion layer 15 is reduced with use of the low-dielectric constant layer 12A as the interlayer insulating film 12, and the barrier E by the voltage application to the second electrode 16 is increased (see FIG. 10B), as compared with the foregoing comparative example, thereby easily suppressing the leakage current.

[Effects]

In the solid-state imaging device 1 as described above, when light enters each of the photoelectric conversion elements 10a through the lens 17, a part (for example, green light) of entered light is absorbed by the photoelectric conversion layer 15. Accordingly, the photoelectric conversion layer 15 generates electron-hole pairs (i.e., performs photoelectric conversion), and electrons or holes are collected, for example, to the first electrode 13 side, and are accumulated in the charge accumulation layer 112 in the substrate 11. Electric charges accumulated in the charge accumulation layer 112 are read out as electrical signals through an unillustrated pixel circuit. In contrast, light that has not been absorbed by the photoelectric conversion layer 15 (for example, blue light and red light) is absorbed in order by the photoelectric conversion elements 110B and 110R to be subjected to photoelectric conversion, and electric charges are read out as electrical signals by color.

The photoelectric conversion elements 10a using the organic semiconductor each include the photoelectric conversion layer 15 between the first electrode 13 and the second electrode 16. However, in some cases, it is difficult to physically separate the photoelectric conversion layer 15 for each of the pixels P. In such a case, one or both of the first electrode 13 and the second electrode 16 are physically separated for each of the pixels P to allow for electrical element isolation without separating the photoelectric conversion layer 15.

In such an element configuration, a distance between the adjacent two of the first electrodes 13 (or between the first electrode 13 and the shield electrode 14) is decreased in association with a reduction in pixel size. Accordingly, when a potential difference arises between the first electrodes 13 (or the between the first electrode 13 and the shield electrode 14), a leakage current between adjacent pixels is generated through the photoelectric conversion layer 15. Further, capacitive coupling is caused as well. Consequently, crosstalk of signals occurs between the adjacent pixels.

The barrier E from the shield electrode 14 to the first electrode 13 is generated in association with voltage application to the second electrode 16, and further increasing the barrier E makes it possible to reduce a leakage current effectively.

In the solid-state imaging device 1 according to the embodiment, the interlayer insulating film 12 adopts a configuration that makes it possible to increase the barrier E, i.e., a configuration that makes it possible to reduce the voltage drop in the photoelectric conversion layer 15. More specifically, when the interlayer insulating film 12 is configured of the low-dielectric constant layer 12A, the relative dielectric constant of the interlayer insulating film 12 is decreased to allow for suppression of the voltage drop in the photoelectric conversion layer 15. This makes it possible to suppress generation of the leakage current between the first electrode 13 and the shield electrode 14.

Moreover, in the embodiment, the shield electrode 14 is formed in a gap between the first electrodes 13 on the interlayer insulating film 12. In other words, the shield electrode 14 is formed on the same plane as the first electrodes 13. Further, both the first electrodes 13 and the shield electrode 14 are in contact with the photoelectric conversion layer 15. Accordingly, the following effect is achieved. When there is a level difference on a base of the photoelectric conversion layer 15, coverage may be deteriorated to cause generation of leakage between the first electrode 13 and the second electrode 16. As with the embodiment, when the shield electrode 14 is formed on the same plane as the first electrodes 13, and both the first electrodes 13 and the shield electrode 14 are in contact with the photoelectric conversion layer 15, planarity of a base layer of the photoelectric conversion layer 15 is easily secured. Moreover, providing the shield electrode 14 makes it possible to suppress capacitive coupling caused between the first electrodes 13.

In contrast, when both the first electrodes 13 and the shield electrode 14 are in contact with the photoelectric conversion layer 15, the leakage current is easily generated between the first electrode 13 and the shield electrode 14 through the photoelectric conversion layer 15. In the embodiment, increasing the barrier E in potential makes it possible to reduce the leakage current as described above. In other words, in the embodiment, it is possible to reduce the leakage current between the first electrode 13 and the shield electrode 14 while securing planarity of the base layer of the photoelectric conversion layer 15.

It is to be noted that in order to control a potential barrier, there is a technique in which a wiring layer for control is formed between pixel electrodes (corresponding to the first electrodes 13) and an insulating film is formed on the wiring layer. In this technique, since the wiring layer for control is formed below the pixel electrodes, the manufacturing processes are complicated, and the number of processes is increased.

As described above, in the embodiment, the first electrodes 13, the photoelectric conversion layer 15, and the second electrode 16 are provided on the substrate 11 with the interlayer insulating film 12 in between, and the substrate 11 (an electric conductor) is so disposed as to oppose the second electrode 16 with the photoelectric conversion layer 15 and the interlayer insulating film 12 in between. More specifically, the substrate 11 is electrically coupled to the second electrode 16 in a region corresponding to a gap between the first electrodes 13 (a region corresponding to a gap between the first electrode 13 and the shield electrode 14). At this occasion, although the barrier E generated between the adjacent two of the first electrodes 13 is increased by voltage application to the second electrode 16, the interlayer insulating film 12 is configured of the low-dielectric constant layer 12A, which makes it possible to further increase the barrier E as compared with a case in which the low-dielectric constant material is not included. This makes it possible to suppress generation of the leakage current between the first electrode 13 and the shield electrode 14.

Next, description is given of other embodiments and modification examples of the foregoing first embodiment. In the following, substantially same components as the components of the foregoing embodiment are denoted by same reference numerals, and any redundant description thereof is omitted.

(Modification Example 1-1)

FIG. 11 illustrates a main part configuration of a solid-state imaging device according to a modification example 1-1. The foregoing first embodiment exemplifies the configuration in which the entirety of the interlayer insulating film 12 is configured of the low-dielectric constant layer 12A. However, the low-dielectric constant material may be provided in a part of the interlayer insulating film 12. For example, a low-dielectric constant layer 12A1 may be formed only in the region Da of the interlayer insulating film 12 as with the modification example. The region Da corresponds to a gap between the first electrode 13 and the shield electrode 14. In this example, in the region Da, the substrate 11 (the silicon layer 11a) opposes the second electrode 16 with the interlayer insulating film 12 (the low-dielectric constant layer 12A1) and the photoelectric conversion layer 15 in between, and is electrically coupled to the second electrode 16.

The low-dielectric constant layer 12A1 is made of a material similar to the material of the low-dielectric constant layer 12A according to the foregoing first embodiment. It is only necessary for the low-dielectric constant layer 12A1 to be formed in a part or the entirety of the region Da corresponding to the gap between the first electrode 13 and the shield electrode 14. A region other than the low-dielectric constant layer 12A1 of the interlayer insulating film 12 may be made of, for example, silicon oxide.

As described above, the low-dielectric constant layer 12A1 may be formed only in a selective region of the interlayer insulating film 12, and even in this case, it is possible to further enhance an effect of increasing the barrier E by voltage application to the second electrode 16 as with the foregoing first embodiment. Moreover, materials having a low relative dielectric constant have some issues such as low mechanical strength, susceptibility to damage by gas during a process, and lowness of reliability as typified by moisture resistance, as compared with typical interlayer insulating film materials such as silicon oxide. Accordingly, a region in which the low-dielectric constant material is used is restricted, and the other region is configured of the interlayer insulating film 12 of silicon oxide or any other interlayer insulating film material, which makes it possible to reduce the leakage current while suppressing a decline in the above-described mechanical strength and any other property.

(Modification Example 1-2)

FIG. 12 illustrates a main part configuration of a solid-state imaging device according to a modification example 1-2. The foregoing first embodiment exemplifies the configuration in which the low-dielectric constant material is used for the interlayer insulating film 12; however, the low-dielectric constant material may not be necessarily used. For example, as with this modification example, a part of the interlayer insulating film 12 may have an air gap 12B. In this example, in the region Da, the substrate 11 (the silicon layer 11a) opposes the second electrode 16 with the air gap 12B in the interlayer insulating film 12 and the photoelectric conversion layer 15 in between, and is electrically coupled to the second electrode 16.

The air gap 12B may be formed in a part or the entirety of the region Da corresponding to the gap between the first electrode 13 and the shield electrode 14. The air gap 12B may be formed as follows. A trench (a groove or a recess) is formed at a predetermined aspect ratio between the first electrode 13 and the shield electrode 14, and a CVD film having low embedability is intentionally used to fill the trench with an insulating film material, which makes it possible to form the air gap 12B.

As described above, the air gap 12B may be formed in a part of the interlayer insulating film 12, and even in this case, it is possible to effectively decrease the relative dielectric constant of the interlayer insulating film 12. Accordingly, it is possible to reduce the leakage current between the first electrode 13 and the shield electrode 14. In other words, it is possible to achieve effects similar to the effects of the foregoing first embodiment in which the low-dielectric constant material is used for the interlayer insulating film 12.

(Second Embodiment)

FIG. 13 illustrates a main part configuration of a solid-state imaging device according to a second embodiment of the disclosure. FIG. 14A is a potential diagram of a cross-section taken along a line A31-A32 of FIG. 13. FIG. 14B is a potential diagram of a cross-section taken along a line B31-B32 of FIG. 13. The solid-state imaging device according to the embodiment may be also applied to, for example, a CCD and a CMOS image sensor as with the solid-state imaging device 1 according to the foregoing first embodiment. In the solid-state imaging device according to the embodiment, a plurality of photoelectric conversion elements 10a (the first electrodes 13, the photoelectric conversion layer 15, and the second electrode 16) are formed on the substrate 11 with the interlayer insulating film 12 in between. The substrate 11 includes the photoelectric conversion elements 110B and 110R. The shield electrode 14 is provided in a gap between the first electrodes 13 on the interlayer insulating film 12. Moreover, although not illustrated in FIG. 13, the protective film 130 and the lens 17 are formed on each of the photoelectric conversion elements 10a.

In such a configuration, even in the embodiment, the barrier E generated by voltage application to the second electrode 16 is further increased as with the foregoing first embodiment. However, unlike the foregoing first embodiment, the substrate 11 may have a locally thin region (a region that has a smaller thickness than its peripheral region). As an example, a surface on the interlayer insulating film 12 side of the substrate 11 (a surface of the silicon layer 11a) may have a recess 12C as illustrated in FIG. 13. In this example, in the region Da, the substrate 11 (the silicon layer 11a) opposes the second electrode 16 with the interlayer insulating film 12 and the photoelectric conversion layer 15 in between, and is electrically coupled to the second electrode 16.

The recess 12C may be formed in a part or the entirety of the region Da corresponding to the gap between the first electrode 13 and the shield electrode 14. The interlayer insulating film 12 is so formed as to be embedded in the recess 12C.

As described above, the substrate 11 may have a region (for example, the recess 12C) having a smaller thickness than the peripheral region. Since the recess 12C is filled with the interlayer insulating film 12, a distance from the second electrode 16 to the surface of the substrate 11 (a thickness of the interlayer insulating film 12 in the region Da) is larger (see FIG. 14A) than that in a case in which the recess 12C is not formed (see FIG. 8A). Accordingly, a capacity caused by the interlayer insulating film 12 out of a capacity formed by the second electrode 16 and the photoelectric conversion layer 15, and a capacity formed by the interlayer insulating film 12 and the substrate 11 is decreased. As a result, a voltage to be applied to the photoelectric conversion layer 15 between the shield electrode 14 and the first electrode 13 is decreased to reduce the leakage current between the shield electrode 14 and the first electrode 13. Thus, even in the embodiment, it is possible to suppress crosstalk of signals caused by the leakage current between adjacent pixels as with the foregoing first embodiment.

(Modification Example 2)

FIG. 15 illustrates a main part configuration of a solid-state imaging device according to a modification example 2. In the foregoing second embodiment, a region having a smaller thickness than its peripheral region is formed on one surface side of the substrate 11. In the modification example, a low carrier density region 12D may be formed on a surface on the interlayer insulating film 12 side of the substrate 11 (a surface of the silicon layer 11a). In this example, in the region Da, the substrate 11 (the silicon layer 11a) opposes the second electrode 16 with the interlayer insulating film 12 and the photoelectric conversion layer 15 in between, and is electrically coupled to the second electrode 16.

The low carrier density region 12D may be formed in a part or the entirety of the region Da corresponding to the gap between the first electrode 13 and the shield electrode 14 on the surface of the silicon layer 11a. The low carrier density region 12D is a region having lower carrier density (a low impurity concentration) than its peripheral region.

As described above, the substrate 11 may have a region (the low carrier density region 12D) having lower carrier density than its peripheral region. When the carrier density is low, a voltage to be applied to the surface of the substrate 11 is increased, as compared with a case in which the carrier density is high. Accordingly, a voltage to be applied to the photoelectric conversion layer 15 is decreased in a capacity formed by the second electrode 16 and the photoelectric conversion layer 15 and a capacity formed by the interlayer insulating film 12 and the substrate 11. As a result, the leakage current between the shield electrode 14 and the first electrode 13 is reduced. Thus, it is possible to achieve effects similar to the effects of the foregoing first and second embodiments.

(Third Embodiment)

FIG. 16 illustrates a main part configuration of a solid-state imaging device according to a third embodiment of the disclosure. FIG. 17A is a potential diagram of cross-sections taken along a line A41-A42 and a line B41-B42 of FIG. 16. FIG. 17B is a potential diagram of a cross-section taken along a line C41-C42 of FIG. 16. The solid-state imaging device according to the embodiment may be also applied to, for example, a CCD and a CMOS image sensor as with the solid-state imaging device 1 according to the foregoing first embodiment. In the solid-state imaging device according to the embodiment, a plurality of photoelectric conversion elements 10a (the first electrodes 13, the photoelectric conversion layer 15, and the second electrode 16) are formed on the substrate 11 with the interlayer insulating film 12 in between. The substrate 11 includes the photoelectric conversion elements 110B and 110R. A shield electrode (a shield electrode 14A) is provided in a gap between the first electrodes 13 on the interlayer insulating film 12. Although not illustrated in FIG. 16, the protective film 130 and the lens 17 are formed on each of the photoelectric conversion elements 10a.

In such a configuration, the work function of the shield electrode 14A (a third electrode) is different from the work function of the first electrode 13 in the embodiment. For example, in a case in which signal charges to be read out from the first electrode 13 are holes, a material having a smaller work function than the first electrode 13 may be used as the material of the shield electrode 14A. More specifically, examples of the material of the first electrode 13 may include an oxide semiconductor including indium (In) and tin (Sn), and examples of the material of the shield electrode 14A may include an oxide semiconductor including indium (In) and zinc (Zn).

In contrast, in a case in which the signal charges to be read out from the first electrode 13 are electrons, a material having a larger work function than the first electrode 13 may be used as the material of the shield electrode 14A. More specifically, examples of the material of the first electrode 13 may include an oxide semiconductor including indium (In) and zinc (Zn), and examples of the material of the shield electrode 14A may include an oxide semiconductor including indium (In) and tin (Sn).

In the embodiment, a material having a work function that is different from the work function of the first electrode 13 is used for the shield electrode 14 as described above. This makes it possible to increase a barrier E2 of injection of charges (holes in this case) from the shield electrode 14A to the photoelectric conversion layer 15 as illustrated in a right diagram of FIG. 17A, and FIG. 17B while securing an electric field for extraction of electric charges between the second electrode 16 and the first electrode 13 as illustrated in a left diagram of FIG. 17A. This makes it possible to suppress injection of electric charges from the shield electrode 14A to the photoelectric conversion layer 15 and to suppress leakage between the first electrode 13 and the shield electrode 14A. Thus, it is possible to suppress crosstalk of signals between adjacent pixels as with the foregoing first embodiment.

(Modification Example 3)

FIG. 18 illustrates a configuration of a solid-state imaging device (a solid-state imaging device 1A) according to a modification example 3. The foregoing first embodiment, other embodiments, and modification examples exemplify a so-called longitudinal stereoscopic type element configuration in which the photoelectric conversion elements 110B and 110R and the photoelectric conversion element 10a are formed in one pixel P; however, an embodiment of the disclosure is applicable to an element configuration of any type other than the foregoing longitudinal stereoscopic type. In the following, description is given of an example of the element configuration.

The solid-state imaging device 1A may be also applied to, for example, a CCD and a CMOS image sensor as with the solid-state imaging device 1 according to the foregoing first embodiment. In the solid-state imaging device 1A, a plurality of photoelectric conversion elements 10a (the first electrodes 13, the photoelectric conversion layer 15, and the second electrode 16) are formed on the substrate 11 with the interlayer insulating film 12 in between. The shield electrode 14 is provided between the first electrodes 13 on the interlayer insulating film 12. The protective film 130 and the lens 17 are formed on each of the photoelectric conversion element 10a.

In the modification example, unlike the foregoing first embodiment, a color filter layer 18 may be provided on light entry side of the photoelectric conversion elements 10a.

The color filter layer 18 may include, for example, a color filter 18R, a color filter 18G, and a color filter 18B. For example, the color filter 18R, the color filter 18G, and the color filter 18B may respectively allow red light, green light, and blue light to selectively pass therethrough. The color filters 18R, 18G, and 18B each are provided for corresponding one of the pixels P (the photoelectric conversion elements 10a). The color filters 18R, 18G, and 18B may be disposed in a so-called Bayer arrangement, for example. It is to be noted that in the modification example, the photoelectric conversion layer 15 may be adapted to absorb, for example, visible light to generate electric charges. Moreover, the photoelectric conversion elements 110B and 110R are not formed in the substrate 11.

As described above, light may be separated with use of the color filter layer 18. This configuration makes it possible to acquire a signal corresponding to light of one of colors R, G, and B in the pixel P.

(Modification Example 4)

FIG. 19 illustrates a configuration of a solid-state imaging device (a solid-state imaging device 1B) according to a modification example 4. The foregoing first embodiment, other embodiments, and modification examples exemplify a so-called longitudinal stereoscopic type element configuration in which the photoelectric conversion elements 110B and 110R and the photoelectric conversion element 10a are formed in one pixel P; however, an embodiment of the disclosure is applicable to an element configuration as with this modification example.

The solid-state imaging device 1B may be also applied to, for example, a CCD and a CMOS image sensor as with the solid-state imaging device 1 according to the foregoing first embodiment. In the solid-state imaging device 1B, a plurality of photoelectric conversion elements 10a (the first electrodes 13, the photoelectric conversion layer 15, and the second electrode 16) are formed on the substrate 11 with the interlayer insulating film 12 in between. The shield electrode 14 is provided between the first electrodes on the interlayer insulating film 12. Moreover, the protective film 130 and the lens 17 are formed on each of the photoelectric conversion elements 10a.

However, in the modification example, unlike the foregoing first embodiment, color filters 18C and 18M may be provided on light entry side of the photoelectric conversion elements 10a. Moreover, the photoelectric conversion element 110B is formed in the silicon layer 11a of the substrate 11. The photoelectric conversion layer 15 may be adapted to absorb, for example, visible light to generate electric charges. The color filters 18C and 18M each may be a complementary filter. The color filter 18C may be adapted to allow, for example, blue light and green light to selectively pass therethrough. The color filter 18M may be adapted to allow, for example, green light and red light to selectively pass therethrough. The photoelectric conversion element 110B is formed in the silicon layer 11a below the photoelectric conversion element 10a on which the color filter 18C is disposed. The photoelectric conversion element 110R is formed in the silicon layer 11a below the photoelectric conversion element 10a in which the color filter 18M is disposed.

As described above, with use of the color filters 18C and 18M each corresponding to a complementary color, out of green light and blue light that have passed through the color filter 18C, the green light is selectively absorbed by the photoelectric conversion element 10a, and the blue light is absorbed by the photoelectric conversion element 110B in the substrate 11. Moreover, out of green light and red light that have passed through the color filter 18M, the green light is selectively absorbed by the photoelectric conversion element 10a, and the red light is absorbed by the photoelectric conversion element 110R in the substrate 11. Such an element configuration may be adopted.

(Modification Example 5-1)

FIG. 20 illustrates a configuration of a solid-state imaging device (a solid-state imaging device 1C) according to a modification example 5-1. The foregoing first embodiment, other embodiments, and modification examples exemplify the configuration in which the shield electrode 14 is provided in a gap between the adjacent two of the first electrodes 13. Alternatively, the shield electrode 14 may not be provided as with this modification example. The shield electrode 14 may not be formed, for example, in a case in which capacitive coupling between the first electrodes 13 is acceptable.

In the solid-state imaging device 1C according to the modification example, the first electrodes 13 of adjacent pixels are adjacent to each other, which may cause a leakage current between the first electrodes 13 through the photoelectric conversion layer 15. Accordingly, the interlayer insulating film 12 may be configured of the low-dielectric constant layer 12A, for example. For a reason similar to that in the foregoing first embodiment, this makes it possible to reduce a voltage drop in the photoelectric conversion layer 15 between the first electrodes 13 and to increase the barrier E by voltage application to the second electrode 16. Accordingly, the generation of the leakage current is suppressed. Thus, it is possible to suppress the generation of the leakage current between the first electrodes 13 and to suppress crosstalk of signals between adjacent pixels.

(Modification Example 5-2)

FIG. 21 illustrates a configuration of a solid-state imaging device (a solid-state imaging device 1D) according to a modification example 5-2. The solid-state imaging device 1D according to the modification example may have a configuration in which the color filter layer 18 as described in the foregoing modification example 3 is provided and the shield electrode 14 is not provided. The contents mentioned above are also applicable to the solid-state imaging device 1D with such a configuration.

(Modification Example 5-3)

FIG. 22 illustrates a main part configuration of a solid-state imaging device according to a modification example 5-3. In a case in which the shield electrode 14 is not formed as with the foregoing modification examples 5-1 and 5-2, a via 122a and a wiring layer 122b may be formed in a region corresponding to a gap between the first electrodes 13 in the interlayer insulating film 12. This makes it possible to control a potential of the photoelectric conversion layer 15 without increasing the number of processes. Since the via 122a and the wiring layer 122b are stacked, when a potential of the wiring layer 122b is fixed, a thickness reaching the wiring layer 122b of the interlayer insulating film 12 becomes larger than a thickness reaching the via 122a of the interlayer insulating film 12, which makes it possible to suppress the leakage current for a reason similar to that in the foregoing second embodiment. The wiring layer 122b opposes the second electrode 16 with the interlayer insulating film 12 and the photoelectric conversion layer 15 in between, and is electrically coupled to the second electrode 16.

(Application Example 1)

FIG. 23 illustrates an overall configuration of an imaging unit in which the solid-state imaging device described in any of the foregoing first embodiment, other embodiments, and modification examples is used in the pixel section 10. FIG. 23 exemplifies the solid-state imaging device 1. The imaging unit includes the pixel section 10 as an imaging region, and may include, for example, a peripheral circuit section 20 in a peripheral region of the pixel section 10. The peripheral circuit section 30 may include, for example, a row scanner 131, a horizontal selector 133, a column scanner 134, and a system controller 132.

The pixel section 110 may include, for example, a plurality of pixels P that are arranged in a two-dimensional array. The pixels P may be wired with pixel drive lines Lread (specifically, row selector lines and reset control lines) for respective pixel rows, and may be wired with vertical signal lines Lsig for respective pixel column. The pixel drive lines Lread are adapted to transmit drive signals to read signals from the pixels. First ends of the pixel drive lines Lread may be coupled to output terminals that correspond to their respective rows of the row scanner 131.

The row scanner 131 may include, for example, a shift register and an address decoder, and may serve as a pixel drive section that drives the pixels P of the pixel section 10, for example, in a row unit. Signals may be outputted from the pixels P of a pixel row selected and scanned by the row scanner 131, and the signals thus outputted may be supplied to the horizontal selector 133 through the respective vertical signal lines Lsig. The horizontal selector 133 may include, for example, an amplifier and horizontal selector switches that are provided for each of the vertical signal lines Lsig.

The column scanner 134 may include, for example, a shift register and an address decoder, and is adapted to scan and sequentially drive the horizontal selector switches of the horizontal selector 133. Such selective scanning by the column scanner 134 allows the signals transmitted from the pixels P through the respective vertical signal lines Lsig to be sequentially transmitted to a horizontal signal line 135 and to be outputted through the horizontal signal line 135.

A circuit part including the row scanner 131, the horizontal selector 133, the column scanner 134, and the horizontal signal line 135 may be formed directly above the substrate 11, or may be provided in an external control IC. Alternatively, the circuit part may be formed on another substrate coupled by a cable, for example.

The system controller 132 is adapted to receive, for example, a clock supplied from the outside, data on instructions of operation modes, and to output data such as internal information of the solid-state imaging device 1. Furthermore, the system controller 132 may include a timing generator that generates various timing signals, and is adapted to perform drive control of peripheral circuits including the row scanner 131, the horizontal selector 133, and the column scanner 134, based on the various timing signals generated by the timing generator.

(Application Example 2)

The solid-state imaging device 1 mentioned above may be applied to various electronic apparatuses having imaging functions. Examples of the electronic apparatuses may include camera systems such as digital still cameras and video cameras, and mobile phones having imaging functions. FIG. 24 illustrates, for purpose of an example, an overall configuration of an electronic apparatus 2 (e.g., a camera). The electronic apparatus 3 may be a video camera configured to capture still images and moving pictures, and may include the solid-state imaging device 1, an optical system (an imaging lens) 310, a shutter device 311, a drive section 313, and a signal processing section 312. The drive section 313 is adapted to drive the solid-state imaging device 1 and the shutter device 311.

The optical system 310 is adapted to guide image light (entering light) from an object toward the solid-state imaging device 1. The optical system 310 may include a plurality of optical lenses. The shutter device 311 is adapted to control a light-irradiating period and a light-shielding period of the solid-state imaging device 1. The drive section 313 is adapted to control transfer operation of the solid-state imaging device 1 and shutter operation of the shutter device 311. The signal processing section 312 is adapted to perform various kinds of signal processing on signals outputted from the solid-state imaging device 1. A picture signal Dout after the signal processing may be stored in a storage medium such as a memory, or may be outputted to a monitor.

Although description has been made by giving the example embodiments and the modification examples as mentioned above, the contents of the disclosure are not limited to the above-mentioned example embodiments and modification examples and may be modified in a variety of ways. In the foregoing embodiments and modification examples, description has been made of the case in which the first electrodes (pixel electrodes) are provided separately for respective pixels in the photoelectric conversion elements formed on the substrate 11 and signal charges are read out from first electrode side; however, the contents of the disclosure are not limited to the case. Alternatively, the second electrodes (upper electrodes) may be separated for respective pixels, and signal charges may be read out from second electrode side.

Moreover, in the foregoing example embodiments and modification examples, the longitudinal stereoscopic type solid-state imaging device has a configuration in which the photoelectric conversion elements 10a are formed on the substrate 11 and the photoelectric conversion elements 110B and 110R are formed in the substrate 11. The photoelectric conversion elements 10a use an organic semiconductor that absorbs green light, and the photoelectric conversion elements 110B and 110R respectively absorb blue light and red light. The element configuration of the solid-state imaging device is not limited thereto. For example, a photoelectric conversion element using two or more kinds of organic semiconductors that perform photoelectric conversion on light of different wavelengths may be stacked on the substrate 11, or one kind or three or more kinds of photodiodes may be formed in the substrate 11.

It is to be noted that the contents of the disclosure may have the following configurations.

(1) A solid-state imaging device, comprising:
a substrate;
at least a first photoelectric conversion element formed in the substrate;
a locally thin region formed in the substrate;
an interlayer insulating film at the first side of the substrate, wherein the interlayer insulating film extends into the locally thin region;
a first electrode at a side of the interlayer insulating film opposite the substrate;
a second electrode; and
a photoelectric conversion layer at least partially between the first electrode and the second electrode.

(2) The solid-state imaging device according to (1), wherein the locally thin region is a recess, and wherein the recess extends from a first side of the substrate towards a second side of the substrate.

(3) The solid-state imaging device according to (1 or 2), wherein the locally thin region formed in the substrate is adjacent the first photoelectric conversion element formed in the substrate.

(4) The solid-state imaging device according to any of (1) to (3), wherein the first electrode, the photoelectric conversion layer, and the second electrode form an organic photoelectric conversion element.

(5) The solid-state imaging device according to (4), wherein at least the organic photoelectric conversion element, and the first photoelectric conversion element form a pixel of the imaging device.

(6) The solid-state imaging device according to any of (1) to (5), further including: a plurality of first electrode; a plurality of first photoelectric conversion elements; a plurality of pixels, wherein each of the pixels in the plurality of pixels includes at least one of the first electrodes; and a plurality of recesses.

(7) The solid-state imaging device according to (6), further including: a plurality of gaps, wherein adjacent first electrodes in the plurality of first electrodes are separated from one another by one of the gaps, wherein pixels in the plurality of pixels are at least partially separated from one another by at least one recess of the plurality of recesses, and wherein each recess in the plurality of recesses is located in a region that encompasses one of the gaps.

(8) The solid-state imaging device according to any of (1) to (7), further including: a second photoelectric conversion element formed in the substrate, wherein the locally thin region formed in the substrate is adjacent the first and second photoelectric conversion elements formed in the substrate.

(9) The solid-state imaging device according to (8), wherein the organic photoelectric conversion element, the first photoelectric conversion element, and the second photoelectric conversion element form a pixel of the imaging device.

(10) The solid-state imaging device according to (8) or (9), wherein the organic photoelectric conversion element, the first photoelectric conversion element, and the second photoelectric conversion element of the pixel are sensitive to different colors.

(11) The solid-state imaging device according to (10), wherein the organic photoelectric conversion element is sensitive to greenlight, wherein the first photoelectric conversion element is sensitive to blue light, and wherein the second photoelectric conversion element is sensitive to red light.

(12) The solid-state imaging device according to any of (1) to (11), further including: a shield electrode on a side of the interlayer insulating film opposite the substrate, wherein the shield electrode is separated from the first electrode by a gap.

(13) The solid-state imaging device according to (2), wherein the shield electrode is located in a same plane as the first electrode.

(14) The solid-state imaging device according to (12) or (13), wherein the shield electrode surrounds the first electrode in the plane.

(15) The solid-state imaging device according to any of (12) to (14), further including a plurality of first electrodes, wherein the first electrodes are arranged in a matrix within the plane.

(16) The solid-state imaging device according to any of (12) to (15), wherein the shield electrode is disposed in a lattice pattern.

(17) The solid-state imaging device according to any of (12) to (16), wherein the recess is located in a region of the device corresponding to the gap.

(18) The solid-state imaging device according to any of (12) to (17), wherein in the region of the device corresponding to the gap, the recess opposes a portion of the second electrode, with only the interlayer insulating film and the photoelectric conversion layer between the recess and the portion of the second electrode.

(19) An electronic apparatus, comprising:
a solid-state imaging device, including:
  a substrate;
  at least a first photoelectric conversion element formed in the substrate;
  a recess formed in the substrate, wherein the recess extends from a first side of the substrate towards a second side of the substrate;
  an interlayer insulating film at the first side of the substrate, wherein the interlayer insulating film extends into the recess;
  a first electrode at a side of the interlayer insulating film opposite the substrate;
  a photoelectric conversion layer, wherein at least a portion of the photoelectric conversion layer is on the first electrode; and
  a second electrode on the photoelectric conversion layer;
a protective film on a side of the second electrode opposite the photoelectric conversion layer; and
a lens adjacent a side of the protective film opposite the second electrode.

(20) A method of forming an image sensor, comprising:
forming a substrate;
forming a locally thin region in the substrate;
forming an interlayer insulating film over the substrate, wherein the interlayer insulating film extends into the locally thin region;
forming a first electrode over the interlayer insulating film;
forming a photoelectric conversion layer on the first electrode; and
forming a second electrode on the photoelectric conversion layer.

It should be understood by those skilled in the art that various modifications, combinations, sub-combinations and alterations may occur depending on design requirements and other factors insofar as they are within the scope of the appended claims or the equivalents thereof.

(21) A solid-state imaging device including:
a plurality of pixels;
a plurality of first electrodes disposed on a substrate with an interlayer insulating film in between, the first electrodes each being provided for corresponding one of the pixels;
a first photoelectric conversion layer provided in contact with the interlayer insulating film on the first electrodes; and
a second electrode disposed on the first photoelectric conversion layer,
wherein the substrate opposes the second electrode with the first photoelectric conversion layer and the interlayer insulating film in between, and the interlayer insulating film includes one of a low-dielectric constant layer and an air gap, the low-dielectric constant layer being made of a low-dielectric constant material.

(22) The solid-state imaging device according to (1), wherein the low-dielectric constant layer is one of a film including silicon oxide ($SiO_x$) and one or more of carbon (C), hydrogen (H), fluorine (F), boron (B), and nitrogen (N), an organic film including one or more of carbon, nitrogen, oxygen (O), hydrogen, fluorine, and boron, and a film having a pore.

(23) The solid-state imaging device according to (1) or (2), wherein the low-dielectric constant layer has a relative dielectric constant of about 3.6 or less.

(24) The solid-state imaging device according to any one of (1) to (3), wherein the low-dielectric constant layer is provided on the entire substrate as the interlayer insulating film.

(25) The solid-state imaging device according to any one of (1) to (3), wherein the low-dielectric constant layer is provided only in a region corresponding to a gap between the first electrodes.

(26) The solid-state imaging device according to any one of (1) to (5), wherein a region corresponding to a gap between the first electrodes has the air gap.

(27) The solid-state imaging device according to any one of (1) to (6), wherein one of a region having a smaller thickness than its peripheral region, and a region having lower carrier density than its peripheral region is provided in a region corresponding to a gap between the first electrodes of a surface on the interlayer insulating film side of the substrate.

(28) The solid-state imaging device according to any one of (1) to (7), further including a third electrode provided in a gap between the first electrodes on the interlayer insulating film.

(29) The solid-state imaging device according to (8), wherein the third electrode has a work function that is different from a work function of the first electrodes.

(30) The solid-state imaging device according to any one of (1) to (9), wherein a wiring layer is provided in the interlayer insulating film, the wiring layer being electrically coupled to the second electrode.

(31) The solid-state imaging device according to any one of (1) to (10), wherein the substrate is electrically coupled to the second electrode in a part or the entirety of a region corresponding to a gap between the first electrodes.

(32) The solid-state imaging device according to any one of (1) to (11), wherein the substrate includes a charge accumulation layer that is electrically coupled to the first electrodes.

(33) The solid-state imaging device according to any one of (1) to (12), further including one or more second photoelectric conversion layers provided in the substrate and configured to absorb color light.

(34) The solid-state imaging device according to any one of (1) to (13), further including one or more color filter layers provided on light entry side of the first photoelectric conversion layer and configured to allow color light to selectively pass therethrough.

(35) A solid-state imaging device including:
a plurality of pixels;
a plurality of first electrodes disposed on a substrate with an interlayer insulating film in between, the first electrodes each being provided for corresponding one of the pixels;

a photoelectric conversion layer provided in contact with the interlayer insulating film on the first electrodes; and a second electrode disposed on the photoelectric conversion layer, wherein the substrate opposes the second electrode with the photoelectric conversion layer and the interlayer insulating film in between, and one of a region having a smaller thickness than its peripheral region, and a region having lower carrier density than its peripheral region is provided in a region corresponding to a gap between the first electrodes of a surface on the interlayer insulating film side of the substrate.

(36) The solid-state imaging device according to (15), wherein the substrate has a recess on the surface on the interlayer insulating film side, and the interlayer insulating film is provided to be embedded in the recess.

(37) A solid-state imaging device including:

a plurality of pixels;

a plurality of first electrodes disposed on a substrate with an interlayer insulating film in between, the first electrodes each being provided for corresponding one of the pixels;

a photoelectric conversion layer provided on the first electrodes;

a second electrode disposed on the photoelectric conversion layer; and a third electrode provided in a gap between the first electrodes on the interlayer insulating film and having a work function that is different from a work function of the first electrodes.

(38) The solid-state imaging device according to (17), wherein signal charges are read out through the first electrodes, and when the signal charges are holes, the work function of the third electrode is smaller than the work function of the first electrodes.

(39) The solid-state imaging device according to (17), wherein signal charges are read out through the first electrodes, and when the signal charges are electrons, the work function of the third electrode is larger than the work function of the first electrodes.

REFERENCE SIGNS LIST 1, 1A to 1D solid-state imaging device
10a, 110B, 110R photoelectric conversion element
11 substrate
11a silicon layer
12 interlayer insulating film
12A, 12A1 low-dielectric constant layer
12B air gap
12C recess
12D low carrier density region
13 first electrode
14, 14A shield electrode
15 photoelectric conversion layer
16 second electrode
17 lens
18 color filter layer
18R, 18G, 18B color filter

The invention claimed is:

1. A solid-state imaging device, comprising:
a substrate;
a first photoelectric conversion element inside the substrate;
a recess in the substrate;
an interlayer insulating film at a first side of the substrate, wherein the interlayer insulating film extends into the recess;
a first electrode at a side of the interlayer insulating film, wherein the side of the interlayer insulating film is opposite to the first side of the substrate;
a second electrode;
a photoelectric conversion layer between the first electrode and the second electrode; and
a shield electrode at the side of the interlayer insulating film, wherein:
the shield electrode is separated from the first electrode by a gap,
a region of the solid-state imaging device comprises the gap,
the region further comprises the recess which opposes a portion of the second electrode, and
in the region, only the interlayer insulating film and the photoelectric conversion layer are between the recess and the portion of the second electrode.

2. The solid-state imaging device of claim 1, wherein the recess extends from the first side of the substrate towards a second side of the substrate.

3. The solid-state imaging device of claim 1, wherein the recess is adjacent to the first photoelectric conversion element.

4. The solid-state imaging device of claim 3, further comprising an organic photoelectric conversion element, wherein the organic photoelectric conversion element includes the first electrode, the photoelectric conversion layer, and the second electrode.

5. The solid-state imaging device of claim 4, further comprising a pixel, wherein the pixel includes the organic photoelectric conversion element and the first photoelectric conversion element.

6. The solid-state imaging device of claim 5, further comprising:
a plurality of first electrodes that includes the first electrode,
a plurality of first photoelectric conversion elements that includes the first photoelectric conversion element,
a plurality of pixels that includes the pixel, wherein each pixel of the plurality of pixels includes at least one of the plurality of first electrodes and at least one of the plurality of first photoelectric conversion elements; and
a plurality of recesses.

7. The solid-state imaging device of claim 6, wherein:
each pair of adjacent first electrodes of the plurality of first electrodes is separated, and
each pair of adjacent pixels of the plurality of pixels is separated by the recess.

8. The solid-state imaging device of claim 4, further comprising a second photoelectric conversion element inside the substrate, wherein the recess in the substrate is adjacent to the first photoelectric conversion element and the second photoelectric conversion element.

9. The solid-state imaging device of claim 8, further comprising a pixel, wherein the pixel includes the organic photoelectric conversion element, the first photoelectric conversion element, and the second photoelectric conversion element.

10. The solid-state imaging device of claim 9, wherein the organic photoelectric conversion element, the first photoelectric conversion element, and the second photoelectric conversion element of the pixel are sensitive to different colors.

11. The solid-state imaging device of claim 10, wherein:
the organic photoelectric conversion element is sensitive to green light,
the first photoelectric conversion element is sensitive to blue light, and
the second photoelectric conversion element is sensitive to red light.

12. The solid-state imaging device of claim 1, wherein the shield electrode and the first electrode are located in a same plane.

13. The solid-state imaging device of claim 12, wherein the shield electrode surrounds the first electrode in the plane.

14. The solid-state imaging device of claim 13, further comprising a plurality of first electrodes that includes the first electrode, wherein each of the plurality of first electrodes are arranged in a matrix within the plane.

15. The solid-state imaging device of claim 14, wherein the shield electrode is in a lattice pattern.

16. The solid-state imaging device of claim 1, wherein the recess is located in the region corresponding to the gap.

17. The solid-state imaging device of claim 1, wherein the first electrode extends from the side of the interlayer insulating film towards the first side of the substrate.

18. An electronic apparatus, comprising:
a solid-state imaging device that comprises:
a substrate;
at least a first photoelectric conversion element inside the substrate;
a recess in the substrate, wherein the recess extends from a first side of the substrate towards a second side of the substrate;
an interlayer insulating film at the first side of the substrate, wherein the interlayer insulating film extends into the recess;
a first electrode at a side of the interlayer insulating film, wherein the side of the interlayer insulating film is opposite to the first side of the substrate;
a photoelectric conversion layer, wherein at least a portion of the photoelectric conversion layer is on the first electrode;
a second electrode on the photoelectric conversion layer; and
a shield electrode at the side of the interlayer insulating film, wherein:
the shield electrode is separated from the first electrode by a gap,
a region of the solid-state imaging device comprises the gap,
the region further comprises the recess which opposes a portion of the second electrode, and
in the region, only the interlayer insulating film and the photoelectric conversion layer are between the recess and the portion of the second electrode;
a protective film, on a side of the second electrode, opposite the photoelectric conversion layer; and
a lens, adjacent to a side of the protective film, opposite the second electrode.

19. A method of forming an image sensor, comprising:
forming a substrate;
forming a first photoelectric conversion element inside the substrate;
forming a recess in the substrate;
forming an interlayer insulating film at a first side of the substrate, wherein the interlayer insulating film extends into the recess;
forming a first electrode at a side of the interlayer insulating film, wherein the side of the interlayer insulating film is opposite to the first side of the substrate;
forming a photoelectric conversion layer on the first electrode;
forming a second electrode on the photoelectric conversion layer; and
forming a shield electrode at the side of the interlayer insulating film, wherein:
the shield electrode is separated from the first electrode by a gap,
a region of a solid-state imaging device comprises the gap,
the region further comprises the recess which opposes a portion of the second electrode, and
in the region, only the interlayer insulating film and the photoelectric conversion layer are between the recess and the portion of the second electrode.

* * * * *